United States Patent
Tsukamoto

(10) Patent No.: US 10,396,024 B2
(45) Date of Patent: Aug. 27, 2019

(54) WIRING SUBSTRATE AND SEMICONDUCTOR DEVICE

(71) Applicant: SHINKO ELECTRIC INDUSTRIES CO., LTD., Nagano-shi, Nagano (JP)

(72) Inventor: Kosuke Tsukamoto, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 12 days.

(21) Appl. No.: 15/627,542

(22) Filed: Jun. 20, 2017

(65) Prior Publication Data

US 2017/0372997 A1 Dec. 28, 2017

(30) Foreign Application Priority Data

Jun. 24, 2016 (JP) ................ 2016-125463

(51) Int. Cl.
 *H01L 23/498* (2006.01)
 *H01L 23/31* (2006.01)
 (Continued)

(52) U.S. Cl.
 CPC ...... *H01L 23/49838* (2013.01); *H01L 21/486* (2013.01); *H01L 21/4857* (2013.01); *H01L 23/3128* (2013.01); *H01L 23/49811* (2013.01); *H01L 23/49822* (2013.01); *H01L 23/49827* (2013.01); *H01L 24/16* (2013.01); *H01L 23/49866* (2013.01); *H01L 23/49894* (2013.01); *H01L 24/13* (2013.01); *H01L 2224/13111* (2013.01); *H01L 2224/13139* (2013.01); *H01L 2224/13144* (2013.01); *H01L 2224/13147* (2013.01); *H01L 2224/16057* (2013.01);
 (Continued)

(58) Field of Classification Search
 CPC .......... H01L 23/49838; H01L 23/3128; H01L 23/49811; H01L 23/49822; H01L 23/49827; H01L 21/4857; H01L 21/486; H01L 27/46
 See application file for complete search history.

(56) References Cited

U.S. PATENT DOCUMENTS 7,190,078 B2 * 3/2007 Khandekar .......... H01L 21/486
  257/621
8,592,988 B2 * 11/2013 Lee .................. H01L 21/76898
  257/773

(Continued)

FOREIGN PATENT DOCUMENTS

JP 2011-134957 7/2011

*Primary Examiner* — Dale E Page
*Assistant Examiner* — Quovaunda Jefferson
(74) *Attorney, Agent, or Firm* — Rankin, Hill & Clark LLP

(57) ABSTRACT

A wiring substrate includes a first insulating layer including a first through-hole formed through the first insulating layer in a thickness direction, a wiring layer formed on a lower surface of the first insulating layer, and a via wiring filled in the first through-hole and connected to the wiring layer, the via wiring having such a shape that it gradually becomes thinner from one side close to the lower surface of the first insulating layer toward the other side close to an upper surface of the first insulating layer, the via wiring including a first recess formed in an upper end surface of the via wiring. An upper end portion of the via wiring is an electrode pad for electric connection with an electronic component.

9 Claims, 17 Drawing Sheets

(51) Int. Cl.
*H01L 23/00* (2006.01)
*H01L 21/48* (2006.01)

(52) U.S. Cl.
CPC ........... *H01L 2224/16104* (2013.01); *H01L 2224/16113* (2013.01); *H01L 2224/16227* (2013.01); *H01L 2224/16237* (2013.01); *H01L 2924/014* (2013.01)

(56) References Cited

U.S. PATENT DOCUMENTS

2006/0178007 A1* 8/2006 Nakamura ........ H01L 21/76843
 438/675
2010/0319966 A1* 12/2010 Liu .................... H05K 3/4682
 174/255
2011/0155442 A1 6/2011 Yamada
2014/0225276 A1* 8/2014 Ho .................... H01L 23/481
 257/774

* cited by examiner

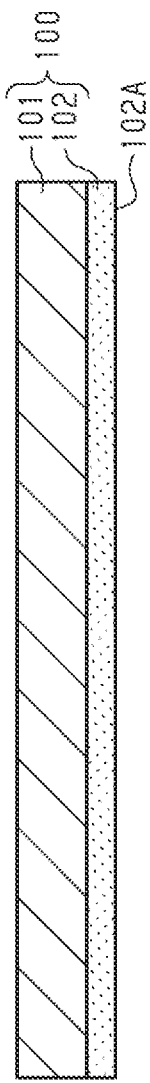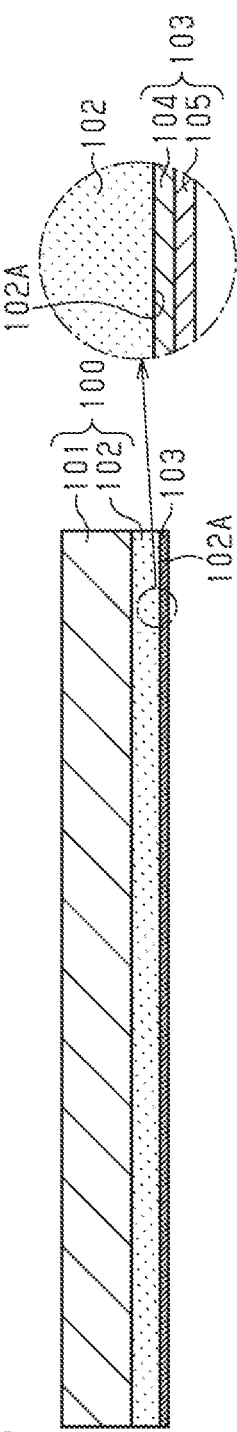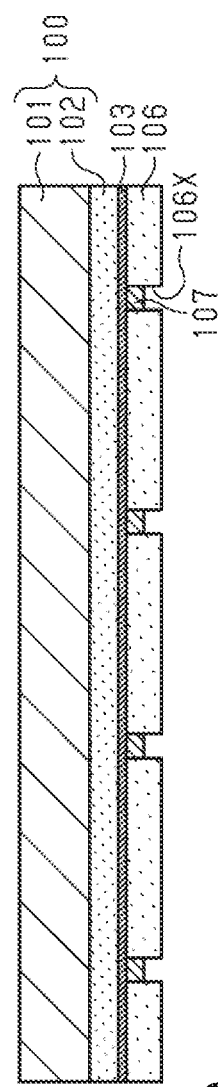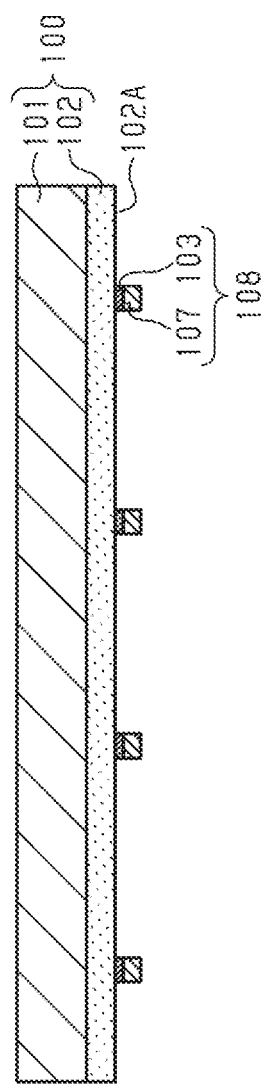
FIG. 3A
FIG. 3B
FIG. 3C
FIG. 3D

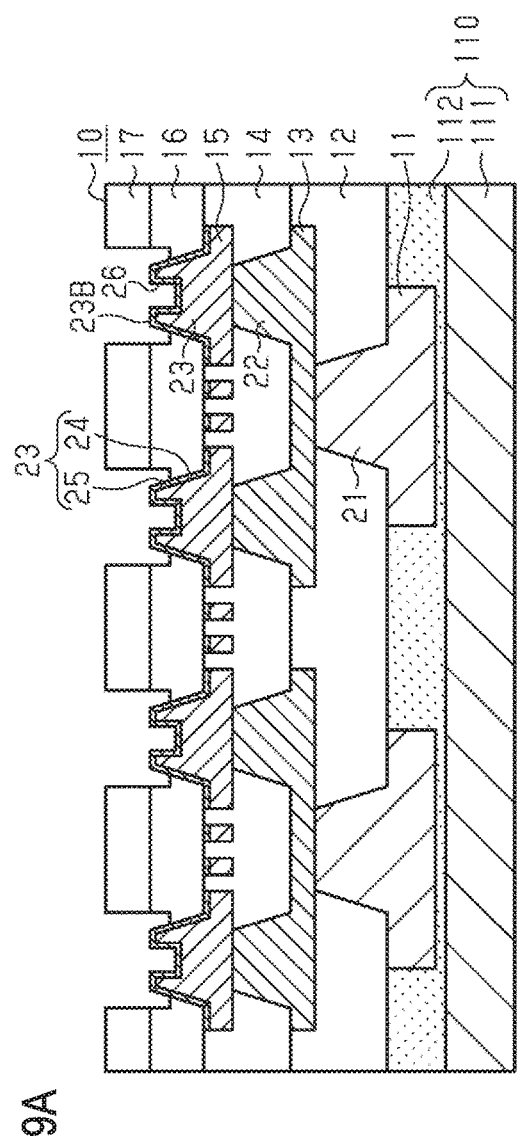
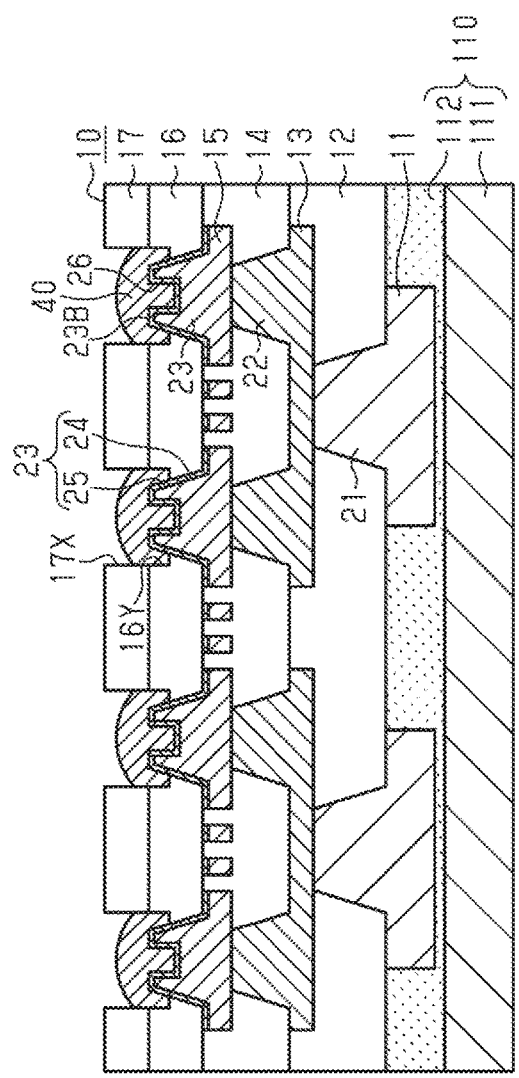
FIG. 9A
FIG. 9B

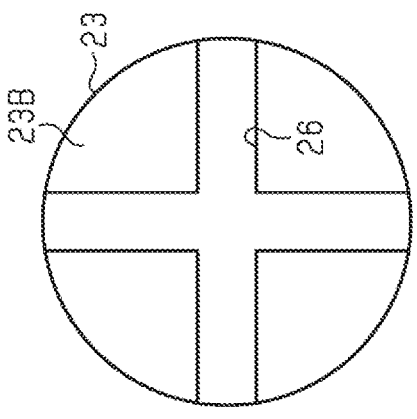
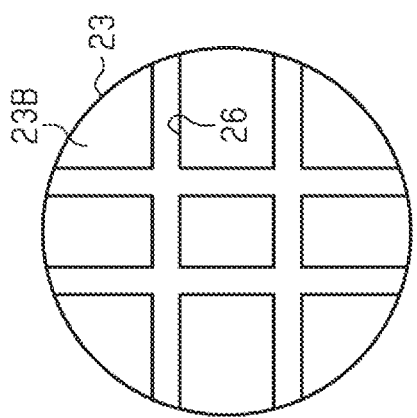
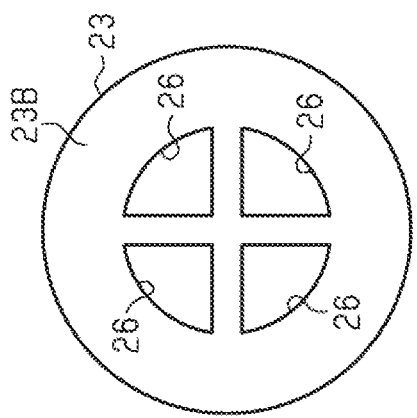

US 10,396,024 B2

WIRING SUBSTRATE AND SEMICONDUCTOR DEVICE

CROSS-REFERENCE TO RELATED APPLICATION

The present application claims priority from Japanese Patent Application No. 2016-125463 filed on Jun. 24, 2016, the entire content of which is incorporated herein by reference.

BACKGROUND

TECHNICAL FIELD

The present invention relates to a wiring substrate, and a semiconductor device.

In the related art, semiconductor devices are mounted on wiring substrates, for example, flip-chip bonding (see Japanese Patent Application Laid-Open No. 2011-134957 for instance). The wiring substrates have electrode pads and resist films provided thereon, and semiconductor devices are connected to the wiring substrates from openings formed in the resist films by bumps formed on the electrode pads.

[Patent Document 1] Japanese Patent Application Publication No. 2011-134957A

However, recently, with an improvement in the degree of integration and functionality of semiconductor devices, the demands for miniaturization and densification of wirings of wiring substrates for mounting semiconductor devices have increased. However, the above-described wiring substrates have a problem in which if the planar shape of electrode pads is reduced, the reliability of the connection of electrode pads and solder bumps decreases.

SUMMARY

A wiring substrate according to an exemplary embodiment is a wiring substrate comprising a first insulating layer including a first through-hole formed through the first insulating layer in a thickness direction, a wiring layer formed on a lower surface of the first insulating layer, and a via wiring filled in the first through-hole and connected to the wiring layer, the via wiring having such a shape that it gradually becomes thinner from one side close to the lower surface of the first insulating layer toward the other side close to an upper surface of the first insulating layer, the via wiring including a first recess formed in an upper end surface of the via wiring. An upper end portion of the via wiring is an electrode pad for electric connection with an electronic component.

According to an aspect of the present invention, an effect in which it is possible to improve connection reliability is achieved.

BRIEF DESCRIPTION OF THE DRAWINGS

FIGS. 3A to 3D are cross-sectional views schematically illustrating a method of manufacturing the wiring substrate of the embodiment.

FIGS. 9A and 9B are cross-sectional views schematically illustrating the method of manufacturing the wiring substrate of the embodiment.

FIGS. 17A to 17C are plan views schematically illustrating via wirings of other modifications.

DETAILED DESCRIPTION

Hereinafter, an embodiment will be described with reference to the accompanying drawings. In the accompanying drawings, for the purpose of convenience, some portions to be features are shown in larger sizes in order to make the features understandable, and the dimensional proportions and the like of individual components may differ from their actual values. Also, in cross-sectional views, in order to make the cross-section structures of individual members understandable, some members are shown in a screentone pattern used as an alternative to hatching, and some members are shown without hatching. Also, in this specification, when an object is referred to as being seen in a plan view means when the object is seen from the vertical dimension of FIG. 1A and so on (the upward and downward direction in those drawings), and the planar shape of an object means the shape of the object seen from the vertical dimension of FIG. 1A and so on.

Figure 1A:
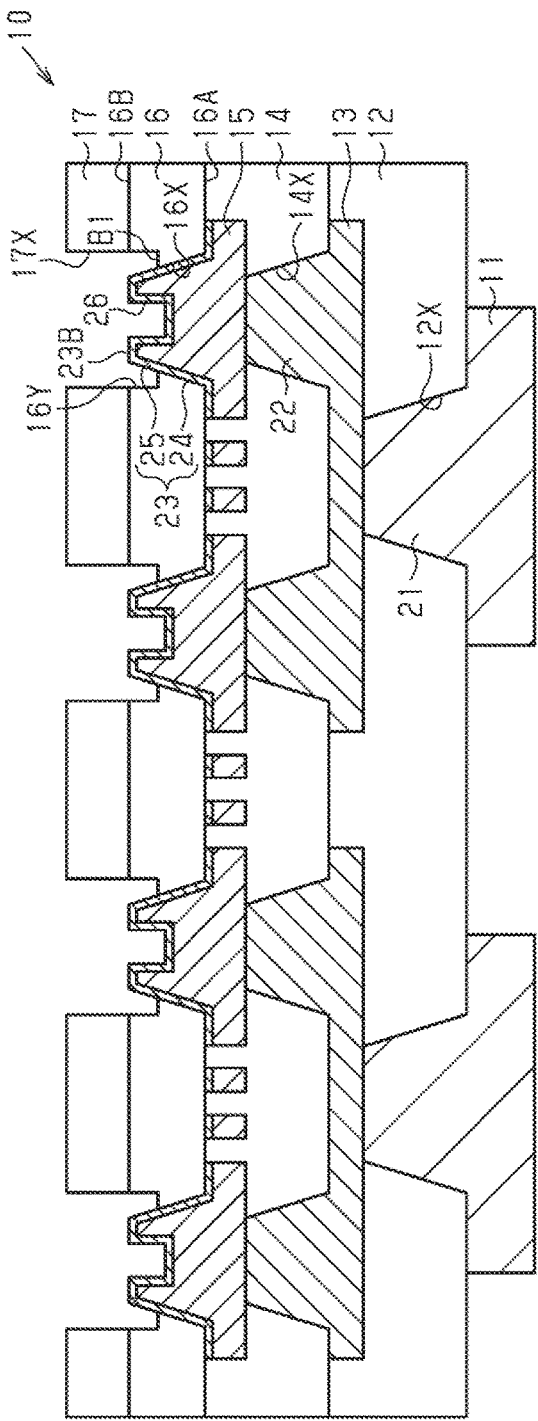
FIG. 1A is a cross-sectional view schematically illustrating a wiring substrate of an embodiment.

As shown in FIG. 1A, a wiring substrate 10 has a stacked structure of a wiring layer 11, an insulating layer 12, a wiring layer 13, an insulating layer 14, a wiring layer 15, an insulating layer 16, and an insulating layer 17 arranged in this order.

As the materials of the insulating layers 12, 14, 16, and 17, for example, insulating resins containing photosensitive resins such as phenol-based resins and polyimide-based resins as their main components can be used. The insulating layers 12, 14, 16, and 17 may contain fillers such as silica and alumina. The thicknesses of the insulating layers 16 and 17 are set, for example, so as to be smaller than those of the insulating layers 12 and 14. For example, the thicknesses of the insulating layers 12 and 14 can be set to about 5 μm to 12 μm, and the thicknesses of the insulating layers 16 and 17 can be set to about 2 μm to 10 μm. However, for example, the thicknesses of the insulating layers 16 and 17 may be the same as the thicknesses of the insulating layers 12 and 14, or may be set to be larger than those of the insulating layers 12 and 14.

On the lower surface 16A of the insulating layer 16, the wiring layer 15, the insulating layer 14, the wiring layer 13, the insulating layer 12, and the wiring layer 11 are sequentially stacked. Also, on the upper surfaces 16B of the insulating layer 16, the insulating layer 17 is stacked.

The wiring layer 15 is formed on the lower surface 16A of the insulating layer 16. The insulating layer 14 is stacked on the lower surface 16A of the insulating layer 16 so as to cover the wiring layer 15. The insulating layer 14 has through-holes 14X formed at desired positions through the insulating layer 14 in the thickness direction so as to expose some portions of the lower surface of the wiring layer 15. Also, the thickness of the wiring layer 15 can be set to, for example, about 2 μm to 5 μm.

The wiring layer 13 is formed on the lower surface of the insulating layer 14. The wiring layer 13 is connected to the wiring layer 15 by via wirings 22 filled in the through-holes 14X of the insulating layer 14. The wiring layer 13 is formed, for example, integrally with the via wirings 22. As the materials of the wiring layer 13 and the via wirings 22, for example, copper (Cu) and copper alloys can be used. The thickness of the wiring layer 13 can be set to, for example, about 2 μm to 5 μm.

The insulating layer 12 is stacked on the lower surface of the insulating layer 14 so as to cover the wiring layer 13. The insulating layer 12 has through-holes 12X formed at desired positions through the insulating layer 12 in the thickness direction so as to expose some portions of the lower surface of the wiring layer 13.

The wiring layer 11 is formed on the lower surface of the insulating layer 12. The wiring layer 11 is connected to the wiring layer 13 by via wirings 21 filled in the through-holes 12X of the insulating layer 12. The wiring layer 11 is formed, for example, integrally with the via wirings 21. As the materials of the wiring layer 11 and the via wirings 21, for example, copper and copper alloys can be used. The thickness of the wiring layer 11 can be set to, for example, about 8 μm to 12 μm.

In the present embodiment, the through-holes 12X and 14X are formed in such tapered shapes that their diameters (opening widths) gradually decrease from the lower side of FIG. 1A (one side close to the wiring layer 11) toward the upper side of FIG. 1A (the other side close to the insulating layer 17). For example, the through-holes 12X and 14X are formed substantially in truncated cone shapes in which the opening diameters of the openings of the lower ends are larger than the opening diameters of the openings of the upper ends. In other words, the through-holes 12X and 14X are formed in truncated cone shapes in which the openings closer to the insulating layer 17 have smaller diameters. For example, the opening diameters of the openings of the lower ends of the through-holes 12X and 14X can be set to about 8 μm to 15 μm, and the opening diameters of the openings of the upper ends of the through-holes 12X and 14X can be set to 4 μm to 10 μm.

Also, similar to the through-holes 12X and 14X, the via wirings 21 and 22 are formed in such tapered shapes that the diameters (widths) gradually decrease from the lower side of FIG. 1A toward the upper side of FIG. 1A. For example, the via wirings 21 and 22 are formed substantially in truncated cone shapes in which the areas of surfaces close to the insulating layer 17 (in the present embodiment, the upper end surfaces) are smaller than the areas of surfaces close to the wiring layer 11 (in the present embodiment, the lower surfaces).

The wiring layer 11 functions as external connection pads which are usable for connection with external connection terminals when the wiring substrate 10 is mounted on a mounting board such as a mother board. Also, on the surface of the wiring layer 11 (on both of the side surface and the lower surface, or only on the lower surface), a surface treatment layer may be formed if necessary. As examples of the surface treatment layer, a gold (Au) layer, a stacked of a nickel (Ni) layer and an Au layer (a metal layer configured by sequentially stacking a Ni layer and an Au layer), a stacked of a Ni layer, a palladium (Pd) layer, and an Au layer (a metal layer configured by sequentially stacking a Ni layer, a Pd layer, and an Au layer), and so on can be taken. Here, an Au layer is a metal layer composed of Au or an Au alloy, and a Ni layer is a metal layer composed of Ni or a Ni alloy, and a Pd layer is a metal layer composed of Pd or a Pd alloy. As the Ni layers, the Au layers, and the Pd layers, for example, metal layers formed by electroless plating (electroless plated metal layers) can be used. Also, on the surface of the wiring layer 11, a surface treatment layer may be formed by performing an anti-oxidation process such as an organic solderability preservative (OSP) process. For example, in a case of performing an OSP process, on the surface of the wiring layer 11, a surface treatment layer may be formed of an organic coating of an azole compound, an imidazole compound, or the like. Also, the wiring layer 11 (in a case where a surface treatment layer is formed on the wiring layer 11, that surface treatment layer) may function as external connection terminals.

The insulating layer 16 has through-holes 16X formed at desired positions through the insulating layer 16 in the thickness direction. Also, in the present embodiment, the insulating layer 16 has recesses 16Y formed so as to be connected to the through-holes 16X and overlap the through-holes 16X as seen in a plan view. The planar shape of the recesses 16Y is set to be larger than the planar shape of the upper openings of the through-holes 16X. Therefore, steps are formed by the inner side surfaces of the through-holes 16X, the bottoms B1 of the recesses 16Y, and the inner side surfaces of the recesses 16Y.

The through-holes 16X are formed in such a tapered shape that the diameter (opening width) gradually decrease from the lower side of FIG. 1A toward the upper side of FIG. 1A. For example, the through-holes 16X are formed substantially in such a truncated cone shape that the opening diameter of the openings of the lower ends is larger than the opening diameter of the openings of the upper ends. In other words, the through-holes 16X are formed in such a truncated cone shape that openings closer to the insulating layer 17 have a smaller diameter. For example, the opening diameter of the openings of the lower ends of the through-holes 16X can be set to about 15 μm to 25 μm, and the opening diameter of the openings of the upper ends of the through-holes 16X can be set to 12 μm to 24 μm.

The planar shape of the recesses 16Y is, for example, the same shape as that of the through-holes 16X (in the present embodiment, substantially a circle shape). The opening diameter of the recesses 16Y is set to be larger than the opening diameter of the upper opening ends of the through-holes 16X. For example, the opening diameter of the recesses 16Y can be set to about 20 μm to 30 μm. Also, the inner side surfaces of the recesses 16Y are formed, for example, as flat surfaces. For example, the inner side surfaces of the recesses 16Y are formed so as to extend substantially in a direction perpendicular to the bottoms B1 of the recesses 16Y (or the lower surface 16A of the insulating layer 16) as seen in a cross-sectional view. Specifically, the inner side surfaces of the recesses 16Y are formed straightly shape from their lower ends close to the insulating layer 14 to their upper ends close to the insulating layer 17 as seen in a cross-sectional view. However, the shape of the recesses 16Y is not limited thereto. For example, the inner side surfaces of the recesses 16Y may be formed as curved surfaces, and the recesses 16Y may be formed in a tapered shape.

Inside the through-holes 16X, via wirings 23 are formed so as to be connected to the wiring layer 15 formed on the lower surface 16A of the insulating layer 16. For example, the via wirings 23 are formed integrally with the wiring layer 15, and have filling portions 24 filled in the through-holes 16X, and bumps 25 formed in the recesses 16Y, integrally with the filling portions 24, and exposed to the outside. The bumps 25 function as electrode pads which are usable for electrical connection with electronic devices such as a semiconductor device 60 (see FIG. 2) when the electronic devices are mounted on the wiring substrate.

The filling portions 24 are formed so as to contact on the inner side surfaces of the through-holes 16X. In other words, the insulating layer 16 to form the inner side surfaces of the through-holes 16X is formed on the outer side surfaces of the filling portions 24 so as to cover those outer side surfaces. Similarly to the through-holes 16X, the filling portions 24 are formed in such a tapered shape that the diameter (width) gradually decreases from the lower side of FIG. 1A (one side close to the wiring layer 11) toward the upper side of FIG. 1A (the other side close to the insulating layer 17). In other words, the filling portions 24 are formed substantially in a truncated cone shape in which the areas of surfaces close to the insulating layer 17 (in the present embodiment, the upper surfaces) are smaller than the areas of surfaces close to the wiring layer 11 (in the present embodiment, the lower surfaces). In other words, the filling portions 24 are formed in such a shape that they gradually become thinner from the lower side of FIG. 1A toward the upper side of FIG. 1A.

The bumps 25 are formed so as to protrude from the insides of the through-holes 16X into the recesses 16Y. In other words, the bumps 25 are formed so as to protrude upward from the bottoms B1 of the recesses 16Y. Similarly to the filling portions 24, the bumps 25 are formed in such a shape that they gradually become thinner from the lower side of FIG. 1A toward the upper side of FIG. 1A. In other words, in the present embodiment, all of the filling portions 24 and the bumps 25 of the via wirings 23 are formed in the shapes that they gradually become thinner from the lower side of FIG. 1A toward the upper side of FIG. 1A. Also, in the present embodiment, the filling portions 24 and the bumps 25 are formed in such tapered shape that their diameters (widths) gradually decrease from the lower side of FIG. 1A toward the upper side of FIG. 1A. In other words, in the present embodiment, the via wirings 23 are formed such that the outer side surfaces of the filling portions 24 are connected to the outer side surfaces of the bumps 25, respectively. For example, the diameter of the lower surfaces of the via wirings 23 can be set to about 15 μm to 25, and the diameter of the upper end surfaces 23B of the via wirings 23 (the bumps 25) can be set to about 12 μm to 24 μm. The pitch of the via wirings 23 can be set to, for example, about 40 μm to 60 μm. For example, the height of the via wirings 23 can be set to about 5 μm to 10 μm, and the height of the bumps 25 (that is, the height from the bottoms B1 of the recesses 16Y to the upper end surfaces 23B of the bumps 25) can be set to about 2 μm to 10 μm.

In the present embodiment, the outer side surfaces of the bumps 25 do not contact on the insulating layer 16, and the outer side surfaces of the bumps 25 are not covered by the insulating layer 16. In other words, the outer side surfaces of the bumps 25 are formed so as to be separated from the inner side surfaces of the recesses 16Y. Therefore, in the present embodiment, the outer side surfaces and upper end surfaces 23B of the bumps 25 are exposed to the outside. Therefore, steps are formed by the bottoms B1 of the recesses 16Y, the outer side surfaces of the bumps 25, and the upper end surfaces 23B of the bumps 25. However, since the bumps 25 are disposed inside the recesses 16Y, in the surrounding areas apart from the bumps 25 in a planar direction (in FIG. 1A, the left-right direction, that is, a direction perpendicular to a direction in which the insulating layers 12, 14, and 16, and so on are stacked, as seen in a cross-sectional view), the insulating layer 16 to form the inner side surfaces of the recesses 16Y is formed. In other words, the bumps 25 are surrounded by the walls of the insulating layer 16 forming the inner side surfaces of the recesses 16Y. Also, the distances between the inner side surfaces of the recesses 16Y and the outer side surfaces of the bumps 25 can be set to, for example, about 5 μm to 10 μm.

The upper end surfaces 23B of the bumps 25 (the via wirings 23) are formed, for example, on the substantially same plane as that of the upper surfaces 16B of the insulating layer 16. In the upper end surfaces 23B of the bumps 25, recesses 26 are formed. The recesses 26 result in irregularities (steps) of the upper end surfaces 23B of the bumps 25.

The insulating layer 17 is stacked on the upper surfaces 16B of the insulating layer 16. The insulating layer 17 has through-holes 17X formed so as to be connected to the recesses 16Y and overlap the recesses 16Y as seen in a plan view. The planar shape of the through-holes 17X is, for example, the same shape as that of the recesses 16Y (in the present embodiment, substantially, a circle shape). For example, the size of the planar shape of the through-holes 17X is the same as the size of the recesses 16Y. In other words, in the present embodiment, the opening diameter of the through-holes 17X is set to the same diameter as the opening diameter of the recesses 16Y. For example, the opening diameter of the recesses 16Y can be set to about 20 μm to 30 μm.

Also, the inner side surfaces of the through-holes 17X are formed, for example, as flat surfaces. For example, the inner side surfaces of the through-holes 17X are formed so as to extend substantially in a direction perpendicular to the bottoms B1 of the recesses 16Y (or the lower surface 16A of the insulating layer 16 as seen in a cross-sectional view. In the present embodiment, the inner side surfaces of the through-holes 17X are formed so as to be connected to the inner side surfaces of the recesses 16Y. Specifically, the inner side surfaces of the through-holes 17X and the inner side surfaces of the recesses 16Y are formed so as to have a straight line shape from the lower ends of the recesses 16Y to the upper ends of the through-holes 17X as seen in a cross-sectional view. The insulating layer 17 to form the inner side surfaces of the through-holes 17X as described above is formed so as to surround the bumps 25 as seen in a plan view. However, the shape of the through-holes 17X is not limited thereto. For this reason, the inner side surfaces of the through-holes 17X may be formed as curved surfaces, and the through-holes 17X may be formed in a tapered shape.

Now, the structures of the wiring layer 15 and the via wirings 23 will be described.

Figure 1B:
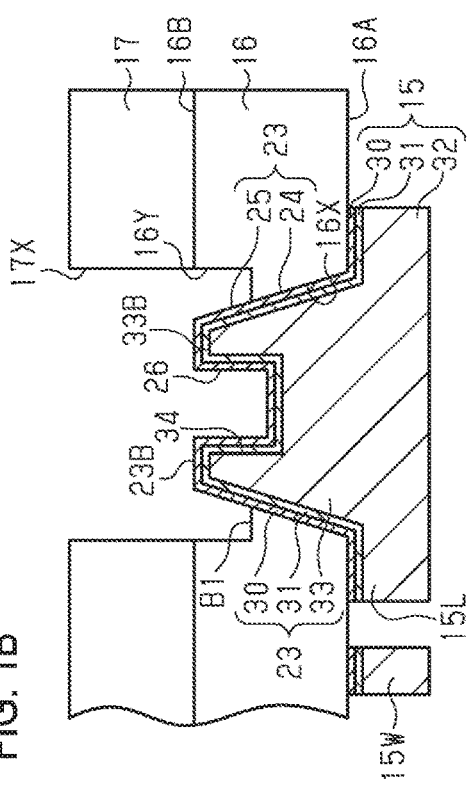
FIG. 1B is an enlarged cross-sectional view illustrating a portion of the wiring substrate shown in FIG. 1A.

As shown in FIG. 1B, the wiring layer 15 has lands 15L, and wiring patterns 15W formed between neighboring lands 15L. The wiring layer 15 includes, for example, a metal film 30 formed on the lower surface 16A of the insulating layer 16, a metal film 31 formed on the lower surface of the metal film 30, and a metal layer 32 formed on the lower surface of the metal film 31. The metal layer 32 included in each land 15L includes a portion formed on the lower surface of the metal film 31 formed on the lower surface 16A of the insulating layer 16 and a portion formed on the lower surface of a corresponding via wiring 23.

The via wirings 23 include, for example, the metal film 30, the metal film 31, and a metal layer 33. Specifically, the filling portion 24 of each via wiring 23 includes the metal film 30 covering the inner side surface of a corresponding through-hole 16X, the metal film 31 covering the side surface of the metal film 30, and the metal layer 33 filling the inner space of the through-hole 16X defined by the metal film 31 formed inside the through-hole. Also, the bump 25 of each via wiring 23 includes the metal layer 33 protruding upward from the bottom B1 of a corresponding recess 16Y, the metal film 31 covering the surface of the metal layer 33 (the upper surface and the side surface) exposed from the insulating layer 16, and the metal film 30 covering the surface of the metal film 31 (the upper surface and the side surface) exposed from the insulating layer 16. The metal layer 33 is formed, for example, integrally with the metal layer 32.

The metal layer 33 is formed so as to fill the inner spaces of the through-holes 16X defined by the metal film 31 formed inside the through-holes and to protrude upward from the bottom B1 of the recess 16Y. For example, the metal layer 33 is formed substantially in such a truncated cone shape that its lower surface is larger than its upper end surface 33B. In other words, the metal layer 33 is formed in such a shape that it gradually becomes thinner from the lower side of FIG. 1B (one side close to the upper surfaces 16B of the insulating layer 16) toward the upper side of FIG. 1B (the other side close to the lower surface 16A of the insulating layer 16). In the upper end surface 33B of the metal layer 33, a recess 34 is formed. The recess 34 is formed from the upper end surface 33B of the metal layer 33 to a predetermined depth in the thickness direction of the metal layer 33. In other words, the recess 34 is formed such that its bottom is positioned at the predetermined depth in the thickness direction of the metal layer 33. The bottom of the recess 34 may be positioned lower than the bottoms B1 of the recesses 16Y, or may be positioned higher than the bottoms B1 of the recesses 16Y. Also, the depth of the recess 34 can be set to, for example, about 2 µm to 3 µm.

The inner side surface of the recess 34 is formed, for example, as a flat surface. For example, the inner side surface of the recess 34 is formed so as to extend substantially in a direction perpendicular to the lower surface 16A of the insulating layer 16 as seen in a cross-sectional view. Specifically, the inner side surface of the recess 34 is formed so as to have a straight line shape from its lower end close to the lower surface 16A of the insulating layer 16 to its upper end close to the insulating layer 17 as seen in a cross-sectional view.

The planar position of the recess 34 can be set to an arbitrary position. Also, the recess 34 can be formed in an arbitrary planar shape and in an arbitrary size.

Figure 1C:
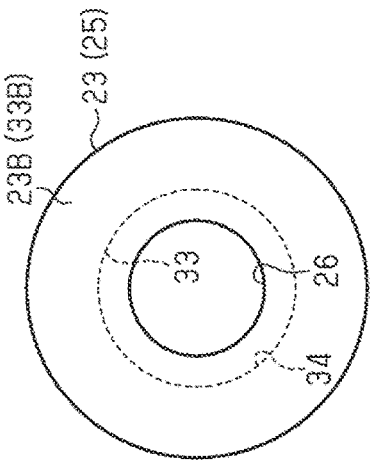
FIG. 1C is a plan view schematically illustrating a via wiring of the embodiment.

In the present embodiment, as shown in FIG. 1C, the recess 34 is formed substantially at the center portion of the upper end surface 33B of the metal layer 33 as seen in a plan view. Also, the planar shape of the recess 34 can be set to, for example, a circle shape having a diameter of about 2 µm to 10 µm.

As shown in FIG. 1B, the upper end surface 33B of the metal layer 33 has a shape having steps attributable to the recess 34. Specifically, the upper end surface 33B of the metal layer 33 has steps (irregularities) along the upper end surfaces 33B, the inner side surfaces of the recess 34, and the bottom of the recess 34.

The metal film 31 is formed so as to cover the whole of the side surface and upper surface of the metal layer 33 including the inner surface of the recess 34 while covering the upper surface of the metal layer 32. The metal film 30 is formed over the whole of the side surface and upper surface of the metal film 31. The metal film 30 of the bump 25 is formed so as to continuously cover the steps formed along the upper end surface 33B of the metal layer 33 and the inner surface of the recess 34, and thus has a shape according to the steps. Therefore, the outermost surface of the bump 25 has the recess 26 having the same planar shape as that of the recess 34, and has steps (irregularities) according to the recess 26. As shown in FIG. 1C, the planar shape of the recess 26 is slightly smaller than the planar shape of the recess 34.

Here, the metal film 30 shown in FIG. 1B functions, for example, as an adhesion layer for improving adhesion of the insulating layer 16 and the metal film 31. Also, the metal film 30 functions, for example, as a barrier layer for suppressing Cu from diffusing from the metal film 31 and the metal layers 31 and 33 (for example, a Cu layer) into the insulating layer 16. As the material of the metal film 30, conductive materials having adhesion to the insulating layer 16 higher than those of metals constituting the metal film 31 (for example, Cu) are preferable. Therefore, as the material of the metal layer 33, for example, metals such as titanium (Ti), aluminum (Al), nickel (Ni), tantalum (Ta), and chrome (Cr), and alloys containing at least one metal selected from those metals can be used. As the materials of the metal film 31 and the metal layers 32 and 33, for example, copper and copper alloys can be used. Also, as the metal films 30 and 31, metal films (sputtering films) formed by sputtering can be used. Also, as the metal layers 32 and 33, for example, metal layers (plated metal layers) formed by electrolytic plating can be used. The thickness of the metal film 30 can be set to, for example, about 10 nm to 50 nm, and the thickness of the metal film 31 can be set to, for example, about 100 nm to 800 nm. The thickness of the metal layer 32 can be set to, for example, about 2 µm to 3 µm.

Now, with reference to FIG. 2, a semiconductor device 50 will be described.

The semiconductor device 50 includes the wiring substrate 10, one or more semiconductor devices 60 (in FIG. 2, one), and a sealing resin 70.

On the bumps 25 of the wiring substrate 10, solder 40 is provided. The solder 40 is provided so as to fill the recesses 26. For example, the solder 40 is provided so as to cover the outer side surfaces of the bumps 25. In the present embodiment, the solder 40 is provided so as to spread in the recesses 16Y and the through-holes 17X. As the solder 40, for example, eutectic solder and lead-free solder (Pb-free solder) (such as solder based on Sn—Ag, Sn—Cu, Su-Ag—Cu, or the like) can be used.

Figure 2:
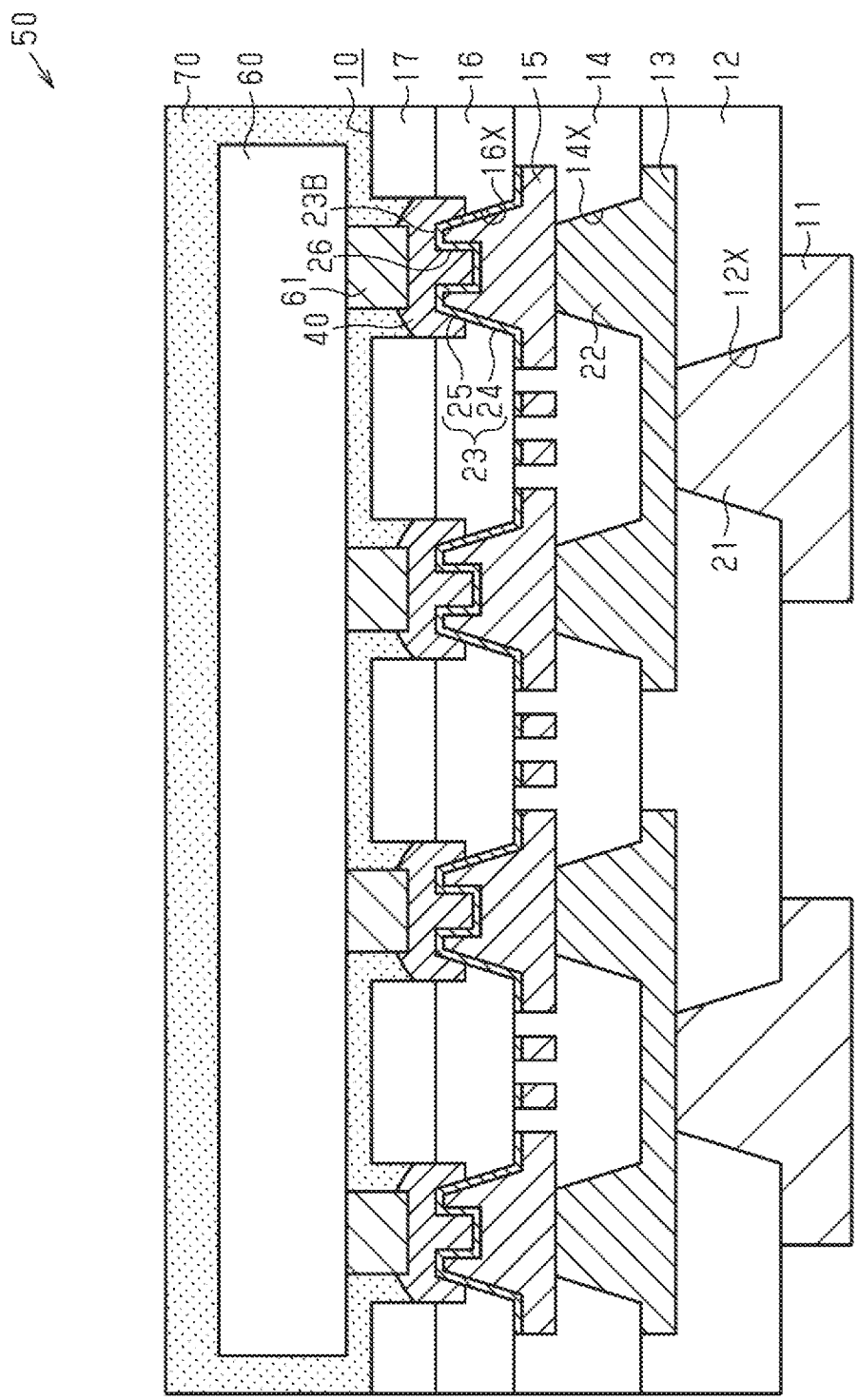
FIG. 2 is a cross-sectional view schematically illustrating a semiconductor device of the embodiment.

The semiconductor device 60 has a plurality of connection terminals 61 on its circuit formation surface (in FIG. 2, the lower surface). The semiconductor device 60 is electrically connected to the bumps 25 of the wiring substrate 10 by the connection terminals 61 and the solder 40. In other words, the semiconductor device 60 is mounted on the wiring substrate 10 by flip-chip bonding.

As the semiconductor device 60, for example, logic chips such as a CPU (central processing unit) chip and a GPU (graphics processing unit) chip can be used. Also, as the semiconductor device 60, for example, memory chips such as a DRAM (dynamic random access memory) chip, an SRAM (static random access memory) chip, and a flash memory chip can be used. Also, in a case of mounting a plurality of semiconductor devices 60 on the wiring substrate 10, logic chips and memory chips may be mounted together on the wiring substrate 10.

As the connection terminals 61, for example, metal posts can be used. The connection terminals 61 are pillar-like connection terminals extending downward from the circuit formation surface of the semiconductor device 60. In the present embodiment, the connection terminals 61 are formed, for example, in a column shape. As the material of the connection terminals 61, for example, copper and copper alloys can be used. Also, as the connection terminals 61, besides metal posts, for example, gold bumps can be used.

The sealing resin 70 is provided on the upper surface of the insulating layer 17 which is the uppermost layer of the wiring substrate 10, so as to seal the semiconductor device 60. The sealing resin 70 is formed so as to cover the upper surface of the insulating layer 17 while covering the circuit formation surface (in the present embodiment, the lower surface), rear surface (in the present embodiment, the upper surface), and side surface of the semiconductor device 60.

As the material of the sealing resin 70, for example, insulating resins having mechanical strength (such as rigidity and hardness) higher than those of the photosensitive resins can be used. As the material of the sealing resin 70, for example, non-photosensitive insulating resins containing thermoplastic resins as their main components can be used. As the material of the sealing resin 70, insulating resins such as an epoxy resin and a polyimide resin, and resin materials produced by mixing fillers such as silica and alumina in those resins can be used. As the sealing resin 70, for example, mold resins can be used. The thickness of the sealing resin 70 can be set to, for example, about 300 μm to 400 μm.

Now, the effects of the wiring substrate 10 and the semiconductor device 50 will be described.

In the wiring substrate 10, the via wirings 23 are formed in such a shape that they gradually become thinner from one side close to the lower surface 16A of the insulating layer 16 toward the other side close to the upper surfaces 16B of the insulating layer 16, and the upper end portions thereof (that is, the narrower upper end portions) are used as electrode pads. Further, in the upper end surfaces 23B of the via wirings 23, the recesses 26 are formed, resulting in the steps (irregularities). Therefore, in a case of providing the solder 40 on the upper end portions of the via wirings 23, the solder 40 enters the recesses 26, and the solder 40 comes into contact with the upper end surfaces 23B of the via wirings 23 and the inner surfaces of the recesses 26. In other words, since the solder 40 and the via wirings 23 are three-dimensionally connected, as compared to a case where the solder 40 is two-dimensionally connected to only the upper end surfaces 23B of the via wirings 23, it is possible to increase the contact area of the solder 40 and the via wirings 23. Therefore, it is possible to improve the reliability of the connection of the solder 40 and the via wirings 23.

Now, methods of manufacturing the wiring substrate 10 and the semiconductor device 50 will be described.

In a process shown in FIG. 3A, a base substrate 100 having a base 101 and a release layer 102 provided on the lower surface of the base 101 is prepared. As the material of the base 101, for example, rigid plate-like materials of silicon, glass, metals (for example, copper), and so on can be used. As the release layer 102, for example, UV-peelable adhesive materials whose adhesion decreases by light energy application using ultraviolet light, and heat-peelable adhesive materials whose adhesion decreases by heat energy application can be used. Also, as the release layer 102, for example, laser-peelable adhesive materials whose adhesion decreases by energy application using laser beams can be used. The release layer 102 can be provided by a method of sticking a sheet-type adhesive material to the lower surface of the base 101, a method of applying a banish-type adhesive material on the lower surface of the base 101, or the like.

In the present embodiment, the lower surface of the base substrate 100, that is, the lower surface 102A of the release layer 102 is a substantially smooth surface (a surface with a low degree of roughness). For example, the roughness of the lower surface 102A of the release layer 102 is set such that the value of surface roughness Ra becomes, for example, about 15 nm to 50 nm. Here, the value of surface roughness Ra is a kind of numerical value representing surface roughness, and is called arithmetic average roughness, and is specifically a value obtained by measuring heights of different points in a measurement area from a surface which is an average line and arithmetically averaging the absolute values of the measured heights.

Subsequently, in a process shown in FIG. 3B, on the lower surface 102A of the release layer 102, a seed layer 103 is formed so as to cover the whole of the lower surface 102A. For example, the seed layer 103 is composed of a metal film 104 covering the whole of the lower surface 102A, and a metal film 105 covering the whole of the lower surface of the metal film 104. The metal films 104 and 105 can be formed, for example, by sputtering, electroless plating, or deposition. As the material of the metal film 104, materials having satisfactory adhesion to the release layer 102 are preferable. As the material of the metal film 104, for example, metals such as Ti, Al, Ni, Cr, and Ta, and alloys containing at least one metal selected from those metals can be used. As the material of the film 105, conductive materials which can be removed selectively with respect to the metal film 30 to be formed in the next process by etching are preferable. As the material of the film 105, for example, metals such as Cu and N, and alloys containing at least one metal selected from those metals can be used. In the present embodiment, as the material of the metal film 104, Ti superior in adhesion to the release layer 102 and so on is used, and as the material of the film 105, Cu is used. In this case, the thickness of the metal film 104 can be set to, for example, about 10 nm to 50 nm, and the thickness of the film 105 can be set to, for example, about 100 nm to 800 nm.

Subsequently, in a process shown in FIG. 3C, on the lower surface of the seed layer 103, a resist layer 106 is formed so as to have opening patterns 106X. The opening patterns 106X are formed so as to expose portions of the lower surface of the seed layer 103 corresponding to areas for forming the recesses 26 (see FIG. 1A). As the material of the resist layer 106, for example, materials resistant to plating with respect to the subsequent plating process can be used. For example, as the material of the resist layer 106, a photosensitive dry film resist, a liquid photoresist (for example, a dry film resist of a novolac resin, an acrylic resin, or the like, or a liquid resist), or the like can be used. For example, in a case of using a photosensitive dry film resist, the lower surface of the seed layer 103 is laminated with the dry film by thermocompression, and the dry film is patterned by photolithography, whereby the resist layer 106 having the opening patterns 106X is formed. Also, even in a case of using a liquid photoresist, in the same process, the resist layer 106 can be formed.

Subsequently, on the portions of the lower surface of the seed layer 103 exposed from the opening patterns 106X of the resist layer 106, a metal layer 107 is formed by performing electrolytic plating (in the present embodiment, electrolytic copper plating) using the resist layer 106 as a plating mask and using the seed layer 103 as a power supply layer for plating. As the material of the metal layer 107, for example, metals such as Cu and Ni, and alloys containing at least one metal selected from those metals can be used. In the present embodiment, as the material of the metal layer 107, Cu is used. In this case, the thickness of the metal layer 107 can be set to, for example, about 2 μm to 3 μm.

Subsequently, in a process shown in FIG. 3D, the resist layer 106 shown in FIG. 3C is removed with a peeling solution (such as an organic-amine-based peeling solution, caustic soda, acetone, or ethanol). Subsequently, unnecessary portions of the seed layer 103 are removed by etching using the metal layer 107 as an etching mask. For example, in the case of the metal film 105 (see FIG. 3B) is composed of Cu, the metal film 105 is removed by wet etching using an etching solution based on a sulfuric acid/hydrogen peroxide mixture. Also, even in a case where the metal film 105 is composed of Ni, the metal film 105 can be removed by wet etching. In a case where the metal film 104 (see FIG. 3B) is composed of, for example, Ti, Al, Ta, or the like, the metal film 104 is removed selectively with respect to the metal layer 107 by dry etching (plasma etching) using an etching gas such as carbon tetrafluoride ($CF_4$). Also, in a case where the metal film 104 is composed of, for example, Ni, Al, Cr, or Ta, the metal film 104 can be removed by wet etching.

By the above-described processes, on the lower surface 102A of the release layer 102, sacrificial patterns 108 having a stacked structure of the seed layer 103 and the metal layer 107 arranged in this order are formed.

Figure 4A:
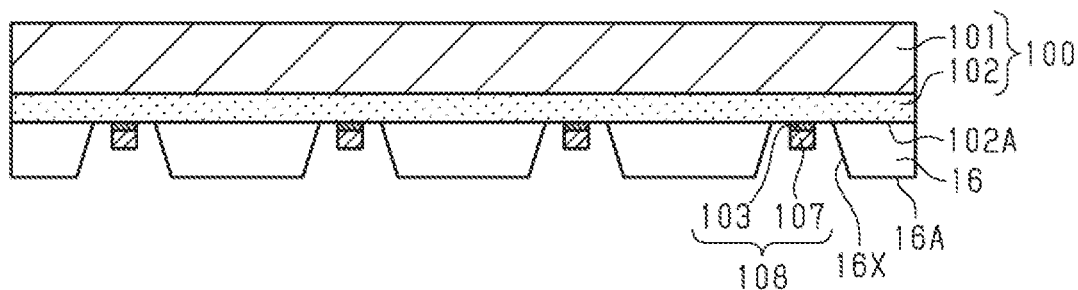
FIG. 4A is a cross-sectional view schematically illustrating the method of manufacturing the wiring substrate of the embodiment.

Subsequently, in a process shown in FIG. 4A, on the lower surface 102A of the release layer 102, the insulating layer 16 is formed so as to have the through-holes 16X at desired positions. The through-holes 16X are formed so as to overlap the sacrificial patterns 108 as seen in a plan view. At this time, the sacrificial patterns 108 are exposed from the bottoms of the through-holes 16X to the outside.

In the present process, in a case of using a resin film as the insulating layer 16, the lower surface 102A of the release layer 102 is laminated with the resin film by thermocompression, and the resin film is patterned by photolithography, whereby the insulating layer 16 is formed. Also, as the resin film, for example, films of photosensitive resins such as phenol-based resins and polyimide-based resins can be used. Alternatively, on the lower surface 102A of the release layer 102, a liquid or pasty insulating resin is applied by spin coating or the like, and the insulating resin is patterned by photolithography, whereby the insulating layer 16 is formed. Also, as the liquid or pasty insulating resin, for example, photosensitive resins such as phenol-based resins and polyimide-based resins can be used.

Also, the roughness of the lower surface 16A of the insulating layer 16 composed of the insulating resin containing such a photosensitive resin as its main component can be controlled, for example, such that the value of surface roughness Ra becomes about 2 nm to 10 nm. In other words, the lower surface 16A of the insulating layer 16 becomes a substantially smooth surface (a surface with a low degree of roughness).

Figure 4B:
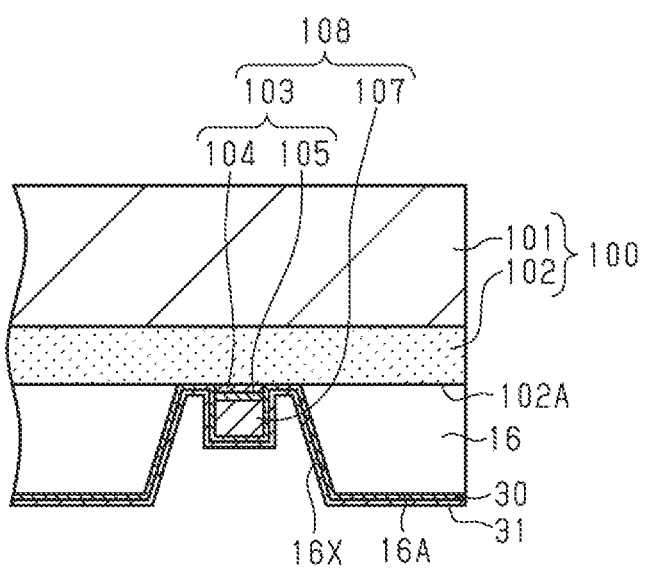
FIGS. 4B and 4C are enlarged cross-sectional views illustrating the method of manufacturing the wiring substrate of the embodiment.

Subsequently, in a process shown in FIG. 4B, the metal film 30 is formed so as to cover the whole of the lower surface 16A of the insulating layer 16, the whole of the side surfaces and lower surfaces of the sacrificial patterns 108 exposed from the bottoms of the through-holes 16X, and the whole of the inner surfaces of the through-holes 16X exposed from the sacrificial patterns 108. Subsequently, the metal film 31 is formed so as to cover the whole of the surface of the metal film 30 (that is, the whole of the lower surface and the side surface). The metal films 30 and 31 can be formed, for example, sputtering or electroless plating.

Figure 4C:
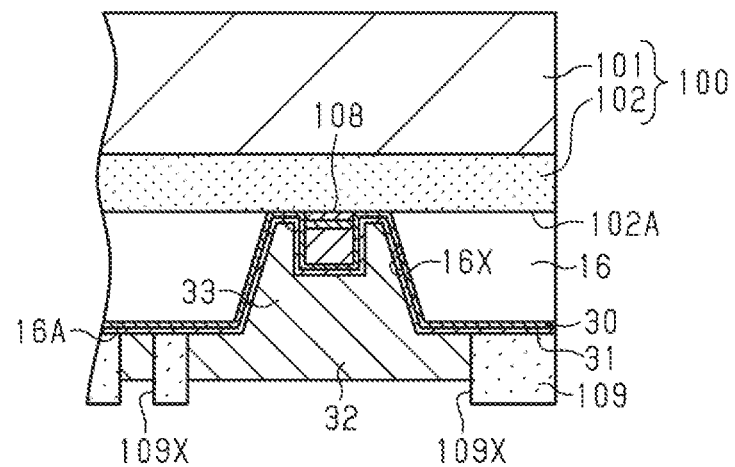

Subsequently, in a process shown in FIG. 4C, on the lower surface of the metal film 31, a resist layer 109 is formed so as to have opening patterns 109X at predetermined positions. The opening patterns 109X are formed so as to expose portions of the metal film 31 corresponding to areas for forming the wiring layer 15 (see FIG. 1A). As the material of the resist layer 109, for example, materials resistant to plating with respect to the subsequent plating process can be used. For example, as the material of the resist layer 109, the same materials as those for the resist layer 106 (see FIG. 3C) can be used. Also, the resist layer 109 can be formed, for example, by the same method as that for the resist layer 106.

Subsequently, on portions of the metal film 31 exposed from the opening patterns 109X of the resist layer 109, electrolytic plating (here, electrolytic copper plating) using the resist layer 109 as a plating mask and using the metal films 30 and 31 as a power supply layer for plating is performed. In this way, the metal layer 33 is formed so as to fill the inner spaces formed by the portions of the metal film 31 formed inside the through-holes 16X, and the metal layer 32 is formed on the metal film 31 formed on the lower surface 16A of the insulating layer 16.

Figure 5A:
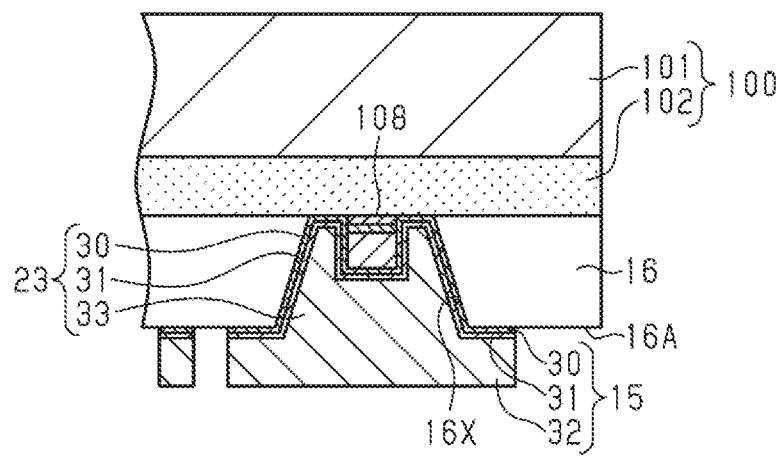
FIGS. 5A and 5B are enlarged cross-sectional views illustrating the method of manufacturing the wiring substrate of the embodiment.

Subsequently, the resist layer 109 is removed, for example, with an alkaline peeling solution. Subsequently, unnecessary portions of the metal films 30 and 31 are removed by etching using the metal layer 32 as an etching mask. For example, in a case where the metal film 31 is composed of Cu, the metal film 31 is removed by wet etching using an etching solution based on a sulfuric acid/hydrogen peroxide mixture. In a case where the metal film 30 is composed of, for example, Ti, Al, Ta, or the like, the metal film 30 is removed by dry etching using an etching gas such as $CF_4$. Also, in a case where the metal film 30 is composed of, for example, Ni, Al, Cr, or Ta, the metal film 30 can be removed by wet etching. In the present process, as shown in FIG. 5A, the via wirings 23 composed of the metal films 30 and 31 and the metal layer 33 formed inside the through-holes 16X are formed in the through-holes 16X. Also, the wiring layer 15 composed of the metal films 30 and 31 and the metal layer 32 formed on the lower surface 16A of the insulating layer 16 is formed on the lower surface 16A of the insulating layer 16. In this way, the wiring layer 15 and the via wirings 23 are formed by a semi-additive method.

Figure 5B:
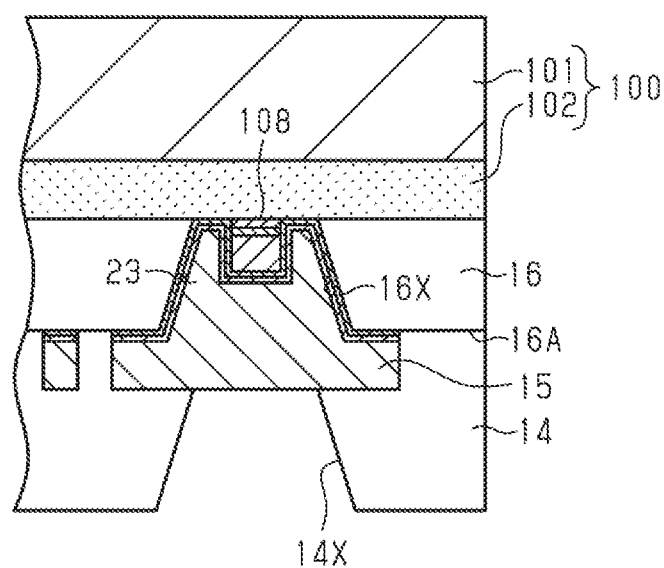

Subsequently, in a process shown in FIG. 5B, similarly in the process shown in FIG. 4A, on the lower surface 16A of the insulating layer 16, the insulating layer 14 is formed so as to have the through-holes 14X exposing some portions of the lower surface of the wiring layer 15.

Figure 6A:
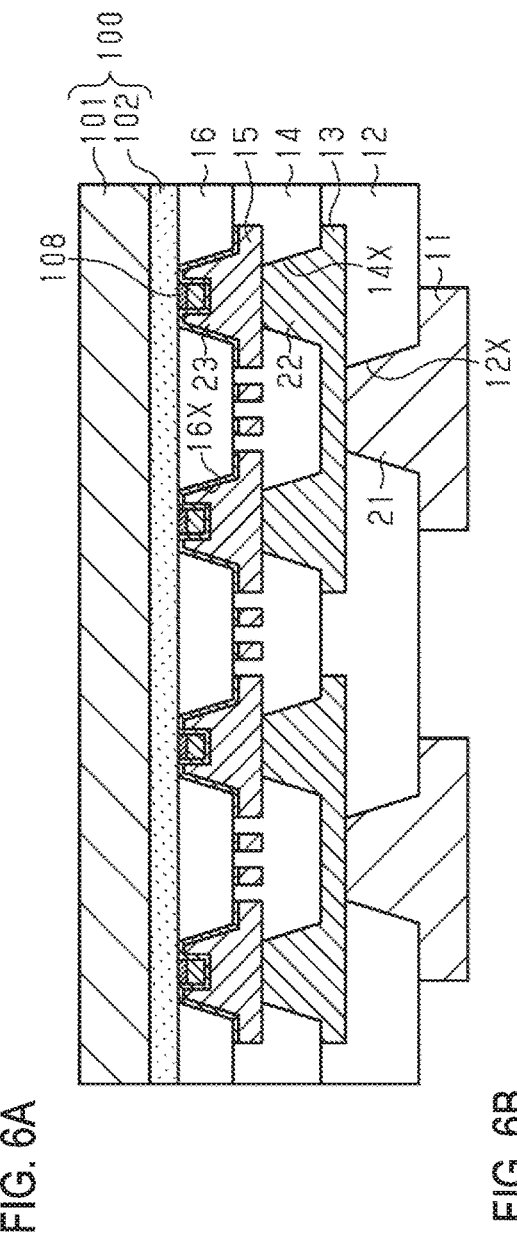
FIGS. 6A and 6B are cross-sectional view schematically illustrating the method of manufacturing the wiring substrate of the embodiment.

Subsequently, in a process shown in FIG. 6A, similarly in the processes shown in FIGS. 4B to 5A, for example, by a semi-additive method, while the via wirings 22 are formed in the through-holes 14X, the wiring layer 13 is formed on the lower surface of the insulating layer 14 so as to be electrically connected to the wiring layer 15 by the via wirings 22.

Subsequently, similarly in the process shown in FIG. 4A, on the lower surface of the insulating layer 14, the insulating layer 12 is formed so as to have the through-holes 12X exposing some portions of the lower surface of the wiring layer 13. Subsequently, similarly in the processes shown in FIGS. 4B to 5A, for example, by a semi-additive method, while the via wirings 21 are formed in the through-holes 12X, the wiring layer 11 is formed on the lower surface of the insulating layer 12 so as to be electrically connected to the wiring layer 13 by the via wirings 21. Also, if necessary, a surface treatment layer may be formed on the surface of the wiring layer 11 (on both of the upper surface and the side surface, or only on the upper surface).

Figure 6B:
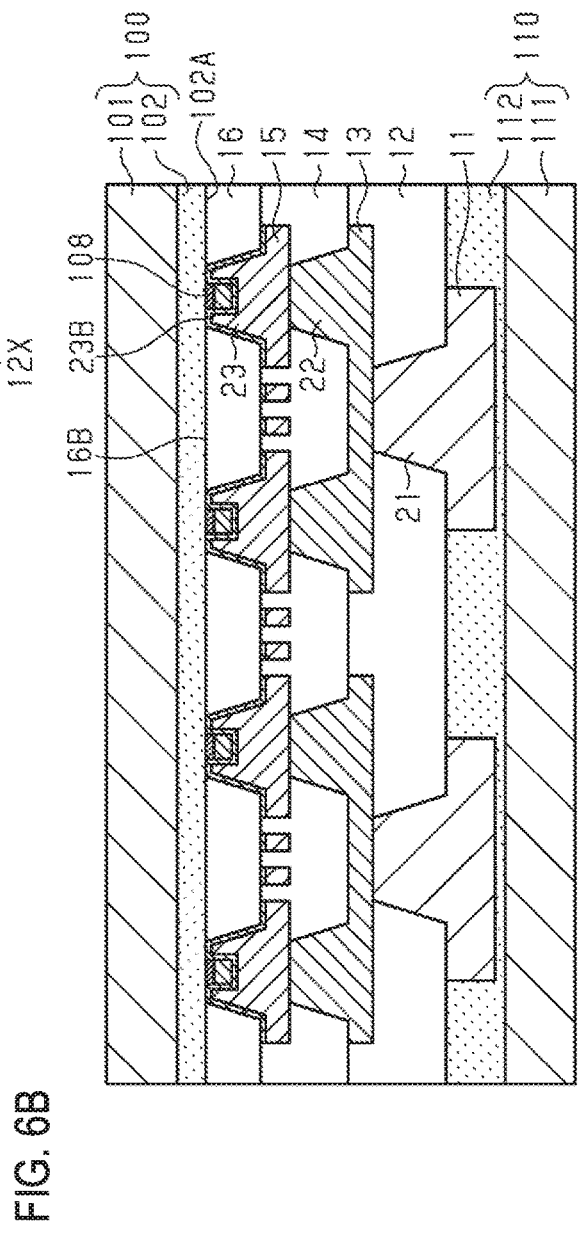

Subsequently, in a process shown in FIG. 6B, on the lower surface of the insulating layer 12, a base substrate 110 is stuck. The base substrate 110 includes, for example, a base 111, and a release layer 112 formed on the upper surface of the base 111. For example, a surface of the base substrate 110 having the release layer 112 formed thereon is stuck to the lower surface of the insulating layer 12. As the material of the base 111, for example, rigid plate-like materials of silicon, glass, metals (for example, copper), and so on can be used. As the release layer 112, for example, UV-peelable adhesive materials, heat-peelable adhesive materials, and laser-peelable adhesive materials can be used.

Here, for example, it is preferable to set the thickness of the release layer 112 to be larger than the thickness of the wiring layer 11. Specifically, the thickness of the wiring layer 11 is, for example, about 8 μm to 12 μm, and the thickness of the release layer 112 is, for example, about 30 μm to 50 μm. Since their thicknesses are set as described above, for example, when the lower surface of the insulating layer 12 is laminated with a sheet-type release layer 112 by thermocompression, the wiring layer 11 is pressed into the release layer 112. Therefore, the whole of the side surface and lower surface of the wiring layer 11 is covered by the release layer 112. If the wiring layer 11 is pressed into the release layer 112 as described above, irregularities of the lower surface side of the insulating layer 12 caused by existence of the wiring layer 11 are absorbed by the release layer 112. Therefore, it is possible to suppress occurrence of a problem in which such irregularities cause adhesion of the base substrate 110 and the insulating layer 12 to decrease. Also, even in a case of applying a banish-type release layer 112 on the lower surface of the insulating layer 12, similarly, the whole of the side surface and lower surface of the wiring layer 11 is covered by the release layer 112.

Figure 7A:
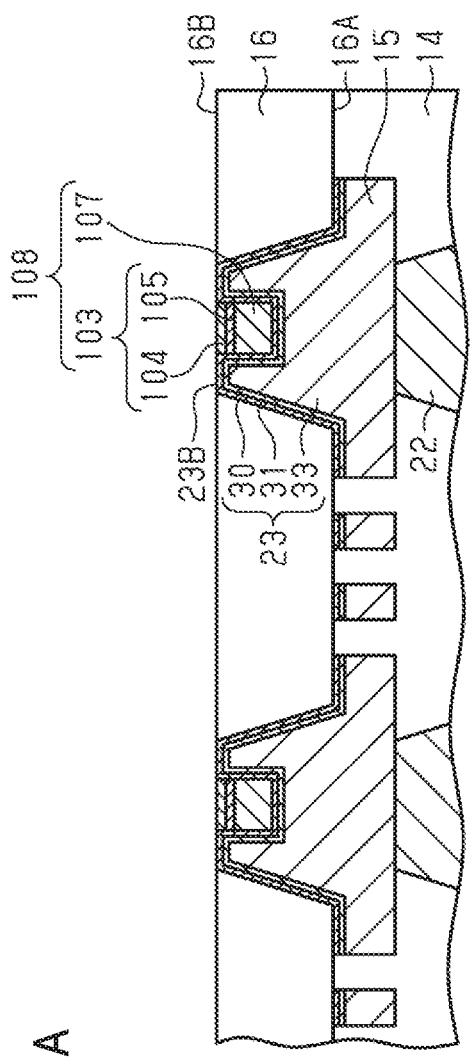
FIGS. 7A and 7B are enlarged cross-sectional views illustrating the method of manufacturing the wiring substrate of the embodiment.

Subsequently, the base substrate 100 is removed from the insulating layer 16. For example, first, in order to reduce the adhesion of the release layer 102, irradiation with ultraviolet light (in a case where the release layer 102 is a UV-peelable adhesive material), heating (in a case where the release layer 102 is a heat-peelable adhesive material), or irradiation with a laser beam (in a case where the release layer is a laser-peelable adhesive material) is performed. Subsequently, the release layer 102 and the base 101 are mechanically peeled off from the insulating layer 16. As a result, as shown in FIG. 7A, the upper surfaces 16B of the insulating layer 16, the upper end surfaces 23B of the via wirings 23, and the upper surfaces of the sacrificial patterns 108 are exposed to the outside. Specifically, the upper surfaces 16B of the insulating layer 16, the upper surface of the metal film 30, and the upper surface of the metal film 104 are exposed to the outside. Before the base substrate 100 is removed, as shown in FIG. 6B, the upper surfaces 16B of the insulating layer 16, the upper end surfaces 23B of the via wirings 23, and the upper surfaces of the sacrificial patterns 108 contact on the lower surface 102A of the release layer 102. Therefore, if the base substrate 100 is removed, they become shapes according to the lower surface 102A (smooth surface) of the release layer 102. In other words, the shape of the lower surface 102A of the release layer 102 is transferred to the upper surfaces 16B of the insulating layer 16, the upper end surfaces 23B of the via wirings 23, and the upper surfaces of the sacrificial patterns 108. Therefore, the upper surfaces 16B of the insulating layer 16, the upper end surfaces 23B of the via wirings 23, and the upper surfaces of the sacrificial patterns 108 form a subsequently smooth surface (for example, a smooth surface in which the value of surface roughness Ra is about 15 nm to 50 nm).

Subsequently, in a process shown in FIG. 7B, similarly in the process shown in FIG. 4A, on the upper surfaces 16B of the insulating layer 16, the insulating layer 17 is formed so as to have the through-holes 17X exposing all of the upper end surfaces 23B of the via wirings 23. The through-holes 17X are formed so as to be larger than the planar shape of the upper end surfaces 23B of the via wirings 23 and overlap the via wirings 23 as seen in a plan view.

Subsequently, in a process shown in FIG. 8A, the metal film 104 (see FIG. 7B) formed as the uppermost layer of the sacrificial patterns 108 is removed, and some portions of the insulating layers 16 and 17 are ground (thinned). For example, the insulating layers 16 and 17 exposed to the outside are generally thinned such that the outer side surfaces of the upper end portions of the via wirings 23 (the outer side surfaces of the upper sides of the via wirings 23) are exposed from the insulating layer 16. Specifically, the insulating layers 16 and 17 are thinned from portions close to the upper surface of the insulating layer 17, portions close to the inner side surfaces of the through-holes 17X, and portions close to the upper surfaces 16B of the insulating layer 16 exposed from the bottoms of the through-holes 17X. As a result, the recesses 16Y are formed in the upper surfaces 16B of the insulating layer 16 exposed from the bottoms of the through-holes 17X, and the outer side surfaces of the upper end portions of the via wirings 23 are exposed from the recesses 16Y to the outside. In other words, the recesses 16Y are formed such that the upper end portions of the via wirings 23 are exposed as the bumps 25 to the outside. The bumps 25 are formed inside the recesses 16Y so as to protrude, and are surrounded by the walls of the insulating layers 16 and 17 (specifically, the insulating layer 16 forming the inner side surfaces of the recesses 16Y and the insulating layer 17 forming the inner side surfaces of the through-holes 17X). Also, in the present process, the metal film 104 of the sacrificial patterns 108 is removed, whereby the upper surfaces of the metal film 105 are exposed to the outside. Also, due to the thinning of the insulating layers 16 and 17, the opening diameter of the through-holes 17X becomes larger than that before the thinning, and the thickness of the insulating layer 17 becomes smaller than that before the thinning.

Figure 7B:
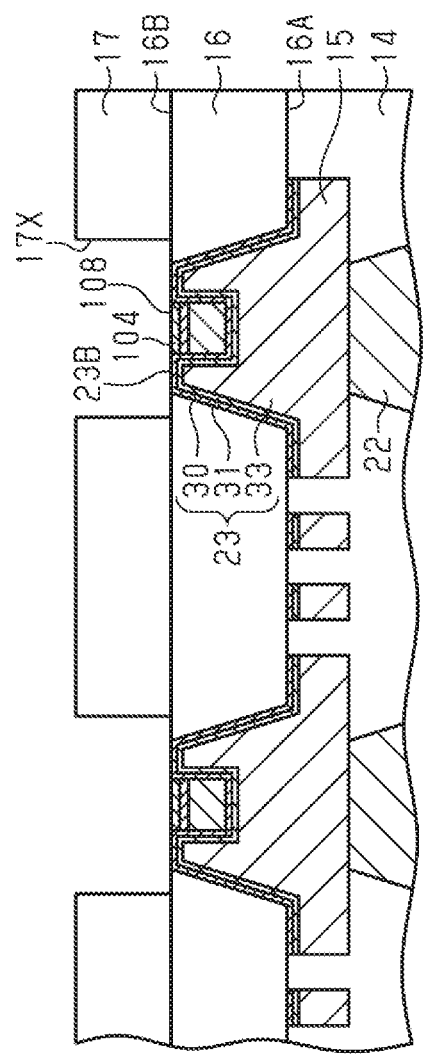

A method which is used in the present process depends on the combination of the materials of the metal film 104 and the metal film 30 forming the outermost surface of the structure shown in FIG. 7B.

For example, in a case where the metal film 104 and the metal layer 30 are composed of different conductive materials (for example, in a case where the metal film 104 is a Ni layer, and the metal film 30 is a Ti layer), the metal film 104 is removed by wet etching. In this case, etching conditions on an etching solution and the like are set such that the metal film 104 (the Ni layer) can be etched selectively with respect to the metal film 30 (the Ti layer). In the case of removing the metal film 104 by wet etching, separately from the wet etching, a process of thinning the insulating layers 16 and 17 is performed. The process of thinning the insulating layers 16 and 17 can be performed, for example, by dry etching (plasma etching) using only $O_2$ gas, without adding $CF_4$ gas and the like. According to the dry etching using only $O_2$ gas, metals are not ground and only the insulating layers 16 and 17 (the photosensitive resin layers) are ground. In the present process, the process of thinning the insulating layers 16 and 17 may be performed before or after the process of removing the metal film 104 by wet etching. Also, as the material of the metal film 104 in a case of removing the metal film 104 by wet etching, for example, a material can be selected from Ni, Al, Cr, and Ta. Also, in this case, as the material of the metal film 30, a metal different from the material of the metal film 104 can be selected, for example, from Ti, Ni, Al, Cr, and Ta.

Meanwhile, in a case where the metal film 104 and the metal film 30 are composed of the same conductive material (for example, in a case where both of the metal layers 104 and 30 are Ti layers), the metal film 104 (a Ti layer) is removed by dry etching using an etching gas such as $CF_4$. However, in this case, by the dry etching, the metal layer 33 (a Ti layer) is also etched. For this reason, in the case where the metal films 104 and 30 are composed of the same conductive material, in the process shown in FIG. 4B, the metal film 30 is formed so as to be thicker than the metal film 104 (for example, so as to have a thickness equal to or larger than twice the thickness of the metal film 104). In this case, even if both of the metal films 104 and 30 are etched by dry etching until the metal film 104 is removed, the metal film 30 formed thick can remain. In other words, according to this method, by dry etching, the metal layer 33 is thinned while the metal film 104 is removed. In this case, by adjusting conditions for dry etching, it is possible to thin the insulating layers 16 and 17 while removing the metal film 104. For example, in a case of dry etching using $CF_4$ gas and $O_2$ gas, by adjusting the ratio of $CF_4$ gas and $O_2$ gas to be added, it is possible to thin the insulating layers 16 and 17 while removing the metal film 104. However, similarly in the case of wet etching, thinning of the insulating layers 16 and 17 may be performed separately from removal of the metal film 104. Also, in the case of removing the metal film 104 by dry etching, as the material of the metal films 104 and 30, for example, a material can be selected from Ti, Al, and Ta.

Subsequently, the metal film 105 and the metal layer 107 are removed by etching using the metal film 30 as an etching mask. For example, in a case where the metal film 105 and the metal layer 107 are composed of Cu, the metal film 105 and the metal layer 107 are removed selectively with respect to the metal film 30 by wet etching using an etching solution based on a sulfuric acid/hydrogen peroxide mixture. In the present process, the sacrificial patterns 108 are removed. As a result, as shown in FIG. 8B, the recesses 26 are formed in the upper end surfaces 23B of the via wirings 23. In other words, the recesses 26 are formed in a shape according to the shape of the sacrificial patterns 108.

By the above-described processes, the wiring substrate 10 is manufactured on the base substrate 110 as shown in FIG. 9A.

Subsequently, in a process shown in FIG. 9B, the solder 40 is provided on the bumps 25 protruding inside the recesses 16Y. For example, the solder 40 can be provided by mounting solder balls or applying solder paste. At this time, the solder 40 is provided so as to enter the recesses 26 of the via wirings 23 and fill the recesses 26. In this case, as compared to a case where the solder 40 is brought into contact with only the upper end surfaces 23B of the via wirings 23, it is possible to increase the contact area of the bumps 25 and the solder 40.

Figures 10A, 10B:
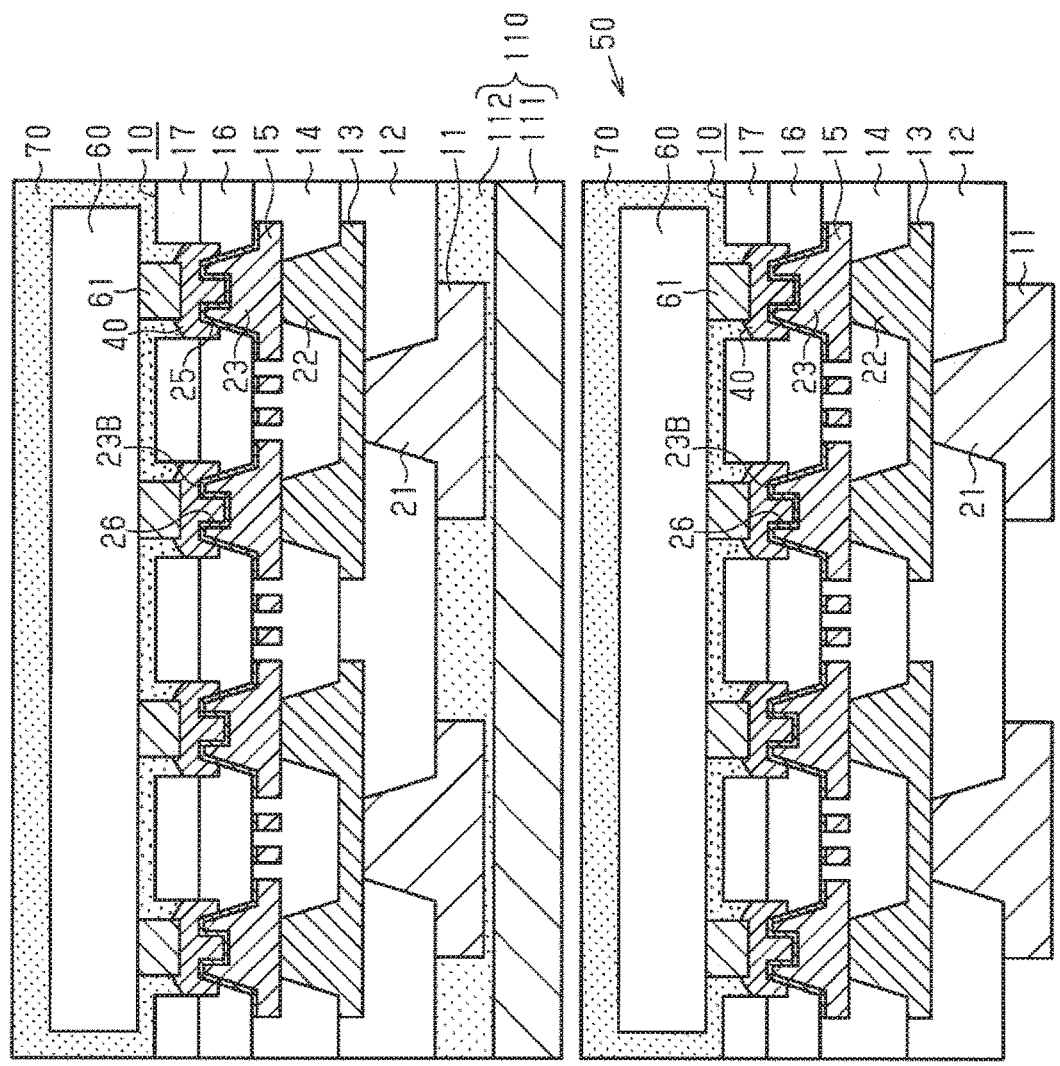
FIGS. 10A and 10B are cross-sectional views schematically illustrating the method of manufacturing the wiring substrate of the embodiment.

Subsequently, in a process shown in FIG. 10A, the semiconductor device 60 having the connection terminals 61 formed on the circuit formation surface (in the present embodiment, the lower surface) is prepared. Subsequently, the connection terminals 61 of the semiconductor device 60 are connected to the bumps 25 by flip-chip bonding. For example, after the connection terminals 61 and the bumps 25 are aligned, the solder 40 is melted by a reflow process, whereby the connection terminals 61 are electrically connected to the bumps 25. During flip-chip bonding, the solder 40 spreads in a planar direction (in FIG. 10A, the left-right direction). At this time, since the bumps 25 are surrounded by the inner side surfaces of the recesses 16Y and the inner side surfaces of the through-holes 17X, the solder 40 is suppressed from spreading in a planar direction. Therefore, it is possible to suitably suppress the solder 40 from causing a short-circuit.

Subsequently, on the upper surface of the insulating layer 17, the sealing resin 70 is formed to seal the semiconductor device 60. For example, the sealing resin 70 is formed so as to cover the whole of the semiconductor device 60 and cover the solder 40 and the surfaces of the connection terminals 61. For example, in a case of using a thermosetting mold resin as the material of the sealing resin 70, the structure obtained by mounting the semiconductor device 60 on the wiring substrate 10 is placed inside a mold, and a pressure (for example, 5 MPa to 10 MPa) is applied to the inside of the mold, and the mold resin in a fluid state is introduced. Thereafter, the mold resin is hardened by heating at a temperature of about 180° C., whereby the sealing resin 70 is formed. Also, as the method of introducing the mold resin into the mold, for example, methods such as transfer molding, compression molding, or injection molding can be used.

Subsequently, the base substrate 110 is removed from the wiring substrate 10. Removal of the base substrate 110 can be performed at the same time as removal of the base substrate 100. For example, after the adhesion of the release layer 112 is reduced by irradiation with ultraviolet light, heating, or irradiation with a laser beam, the release layer 112 and the base 111 are mechanically peeled off from the wiring substrate 10 (the insulating layer 12). As a result, as shown in FIG. 10B, the lower surface of the insulating layer 12 and the side surface and lower surface of the wiring layer 11 are exposed to the outside. By the above-described manufacturing process, it is possible to manufacture the semiconductor device 50 shown in FIG. 2.

According to the above-described embodiment, the following effects can be achieved.

(1) The via wirings 23 are formed in such a shape that they gradually become thinner from one side close to the lower surface 16A of the insulating layer 16 toward the other side close to the upper surfaces 16B of the insulating layer 16, and the upper end portions thereof, that is, the narrower upper end portions are used as electrode pads. In this case, since it is possible to easily downsize the planar shape of the electrode pads, it is possible to cope with a reduction in the pitch of the connection terminals 61 of the semiconductor device 60. Further, in the upper end surfaces 23B of the via wirings 23, the recesses 26 are formed, resulting in the steps (irregularities). In this case, since it is possible to three-dimensionally connect the solder 40 and the via wirings 23, as compared to a case where the solder 40 is two-dimensionally connected to only the upper end surfaces 23B of the via wirings 23, it is possible to increase the contact area of the solder 40 and the via wirings 23. Therefore, even in a case where the planar shape of the upper end portions of the via wirings 23 (that is, the electrode pads) is reduced, it is possible to suitably improve the reliability of the connection of the solder 40 and the electrode pads.

(2) On the upper surface of the insulating layer 16, the recesses 16Y are formed so as to expose the outer side surfaces of the upper end portions of the via wirings 23 (that is, the bumps 25). Therefore, in a case of providing the solder 40 on the upper end portions of the via wirings 23, it is possible to bring the solder 40 into contact with the outer side surfaces of the bumps 25, and thus it is possible to increase the contact area of the solder 40 and the via wirings 23. Therefore, it is possible to improve the reliability of the connection of the solder 40 and the via wirings 23.

(3) The bumps 25 are surrounded by the inner side surfaces of the recesses 16Y and the inner side surfaces of the through-holes 17X. In this case, the solder 40 is suppressed from spreading in a planar direction. Therefore, even in a case where the pitch of the bumps 25 is reduced, it is possible to suitably suppress the solder 40 from causing a short-circuit.

(4) The bumps 25 are formed inside the recesses 16Y of the insulating layer 16. As a result, the bumps 25 are surrounded by the insulating layer 16 forming the inner side surfaces of the recesses 16Y, and are protected by the insulating layer 16. Therefore, it becomes difficult for an external force such as a touch to be applied to the bumps 25. Therefore, it is possible to suppress the bumps 25 from being deformed by an external force, and thus it is possible to improve the reliability of the connection of the bumps 25 and the solder 40.

(5) The bumps 25 are formed in such a tapered shape that they gradually become thinner from one side close to the lower surface 16A of the insulating layer 16 toward the other side close to the upper surfaces 16B of the insulating layer 16. If the outer side surfaces of the bumps 25 are formed as inclined surfaces as described above, as compared to bumps which does not have a tapered shape, concentration of stress on the bumps 25 is alleviated. Therefore, it is possible to suitably suppress problems such as cracking and disconnection from occurring in the bumps 25.

(Other Embodiments)

The above-described embodiment can also be implemented in the following modes obtained by appropriately modifying the embodiment.

Figure 11:
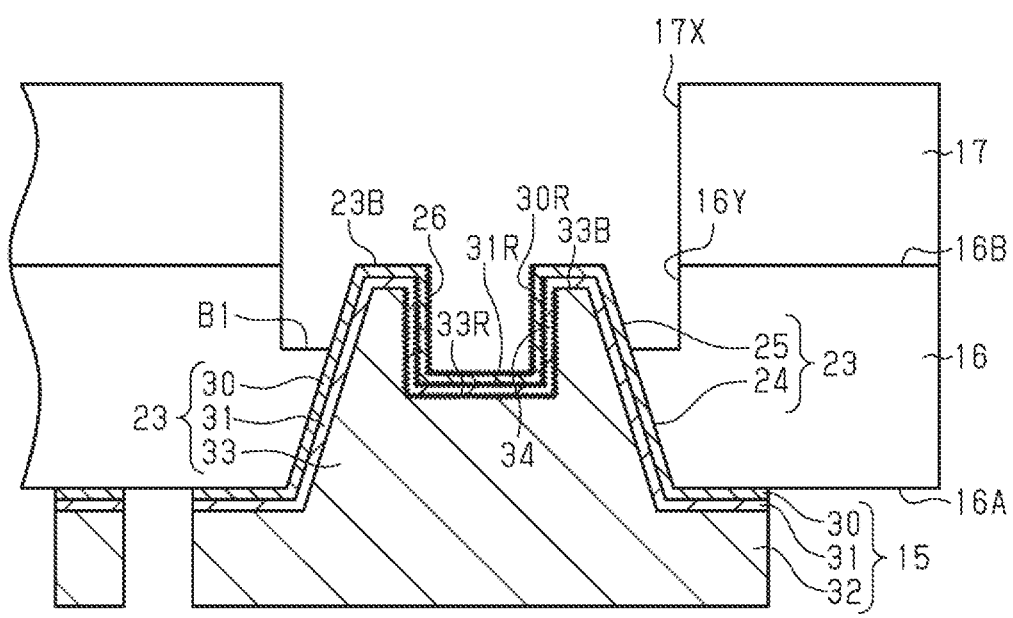
FIG. 11 is an enlarged cross-sectional view illustrating a portion of a wiring substrate of a first modification.

As shown in FIG. 11, the inner side surfaces and bottoms of the recesses 26 may be formed as roughened surfaces 30R having, for example, a degree of surface roughness higher than that of the upper end surfaces 23B of the via wirings 23. Due to the formation of the roughened surfaces 30R, in a case of providing the solder 40 (see FIG. 2) on the bumps 25, it is possible to increase the contact area of the via wirings 23 (the metal film 30) and the solder 40. In this case, the inner side surfaces and bottoms of the recesses 34 of the metal layer 33 may be formed as roughened surfaces 33R having, for example, a degree of surface roughness higher than those of the upper end surfaces 33B of the metal layer 33 and the upper end surfaces 23B of the via wirings 23. Also, the surface of the metal film 31 to cover the roughened surfaces 33R may be formed as a roughened surface 31R having a degree of surface roughness higher than that of the upper end surfaces 23B of the via wirings 23.

The roughened surfaces 30R, 31R, and 33R can be formed, for example, by the following method. Specifically, after a roughening process is performed on the sacrificial patterns 108 formed in the process shown in FIG. 3A, the metal films 30 and 31 and the metal layer 33 are sequentially formed, whereby it is possible to form the roughened surfaces 30R, 31R, and 33R. The roughening process on the sacrificial patterns 108 can be performed, for example, by an etching process, a blackening process, a CZ process.

Also, in the modification shown in FIG. 11, the roughened surfaces 33R and the roughened surface 31R may be omitted.

Figure 12:
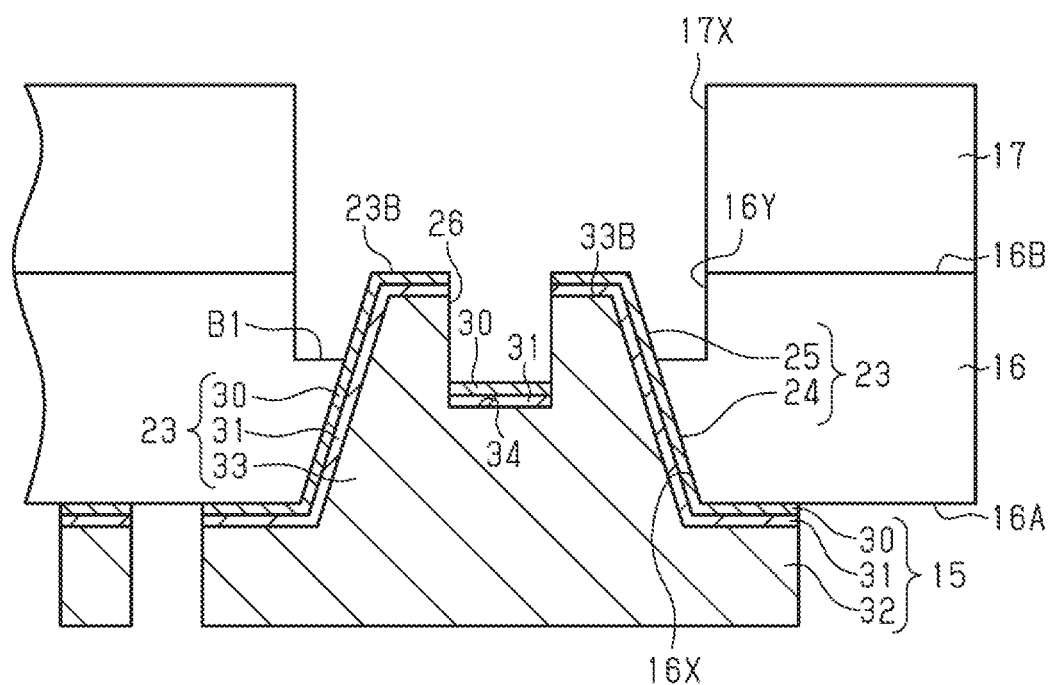
FIG. 12 is an enlarged cross-sectional view illustrating a portion of a wiring substrate of second modification.

As shown in FIG. 12, the metal films 30 and 31 covering the inner side surfaces of the recesses 34 of the metal layer 33 may be omitted. In other words, in this case, the metal films 30 and 31 are formed so as to expose the inner side surfaces of the recesses 34. Specifically, the metal film 31 is formed so as to cover the outer side surfaces and upper end surfaces 33B of the metal layer 33 and the bottoms of the recesses 34 and expose the inner side surfaces of the recesses 34. The metal film 30 is formed so as to cover the upper surfaces and outer side surfaces of the metal film 31 and expose the inner side surfaces of the recesses 34. Therefore, the metal film 31 covering the upper end surfaces 33B of the metal layer 33 are separated from the metal film 31 covering the bottoms of the recesses 34. Similarly, the metal film 30 formed on the upper end surfaces 33B of the metal layer 33 is separated from the metal film 30 formed on the bottoms of the recesses 34.

Hereinafter, an example of a method of manufacturing via wirings 23 having the above-described structure will be described.

Figure 13A:
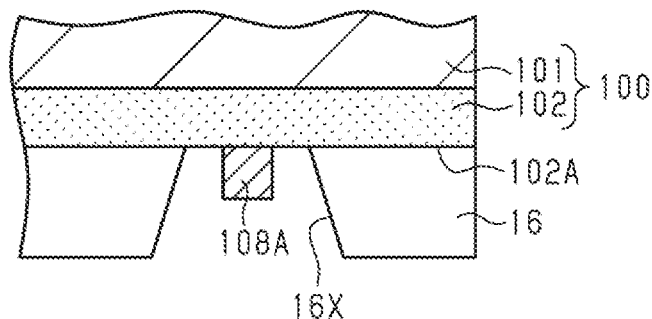
FIGS. 13A to 13D are enlarged cross-sectional views illustrating a method of manufacturing the wiring substrate of the second modification.

First, in a process shown in FIG. 13A, on the lower surface 102A of the release layer 102 of the base substrate 100, sacrificial patterns 108A are formed. In this case, as the material of the sacrificial patterns 108A, conductive materials which can be removed selectively with respect to the metal films 30 and 31 and the metal layer 33 to be formed in the subsequent process by etching can be used. As the material of the sacrificial patterns 108A, for example, a material can be selected from Ni, Al, Cr, and Ta. Also, the sacrificial patterns 108A may have a structure composed of one metal layer, and may have a stacked structure of a plurality of metal layers.

Subsequently, similarly in the process shown in FIG. 4A, on the lower surface 102A of the release layer 102, the insulating layer 16 is formed so as to have the through-holes 16X.

Figure 13B:
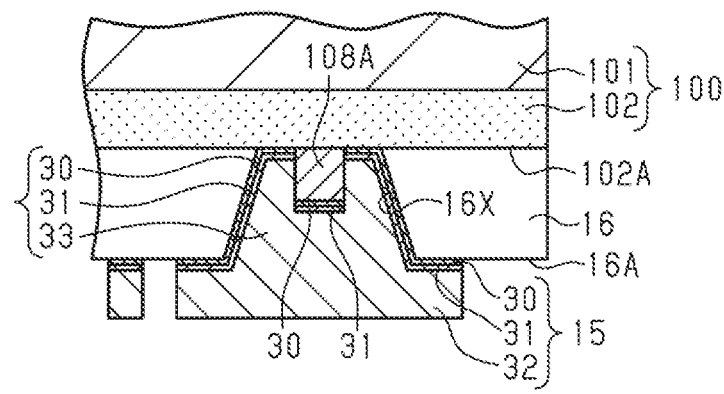

Subsequently, in a process shown in FIG. 13B, similarly in the processes shown in FIGS. 4B to 5A, the via wirings 23 which are composed of the metal films 30 and 31 and the metal layer 33 are formed, and the wiring layer 15 which is composed of the metal films 30 and 31 and the metal layer 33 is formed. At this time, the metal film 30 is formed so as to continuously cover the lower surface 16A of the insulating layer 16, the inner side surfaces of the through-holes 16X, and the bottoms of the through-holes 16X and cover the lower surfaces of the sacrificial patterns 108A. The metal film 31 is formed so as to cover the lower surface and side surface of the metal film 30. In short, in the present process, the metal films 30 and 31 are formed so as to expose some portions of the outer side surfaces of the sacrificial patterns 108A. In other words, some portions of the outer side surfaces of the sacrificial patterns 108A are exposed from the metal films 30 and 31 and are covered by the metal layer 33.

Figure 13C:
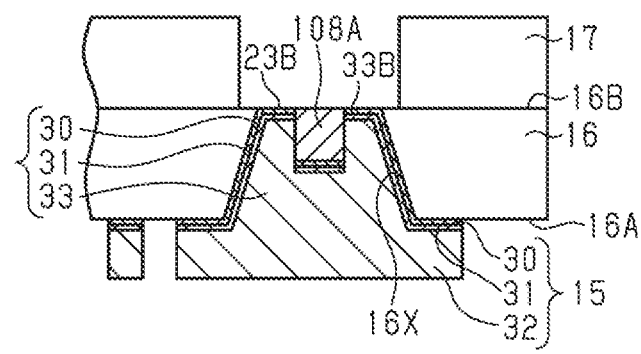

Subsequently, in a process shown in FIG. 13C, the same processes as the processes shown in FIGS. 5B to 7B are performed, whereby a structure which has the insulating layer 17 formed on the upper surfaces 16B of the insulating layer 16 and in which the upper surfaces of the sacrificial patterns 108A and the upper end surfaces 23B of the via wirings 23 are exposed from the upper surface of the insulating layer 16 is obtained.

Subsequently, the sacrificial patterns 108A are removed selectively with respect to the metal films 30 and 31 and the metal layer 33 by wet etching. In this case, etching conditions on an etching solution and the like are set such that the sacrificial patterns 108A can be etched selectively with respect to the metal films 30 and 31 and the metal layer 33. If the sacrificial patterns 108A are removed, as shown in FIG. 13D, the recesses 26 are formed in the upper end surfaces 23B of the via wirings 23, and portions of the metal layer 33 forming the inner side surfaces of the recesses 26 and the recesses 34 are exposed to the outside.

Figure 13D:
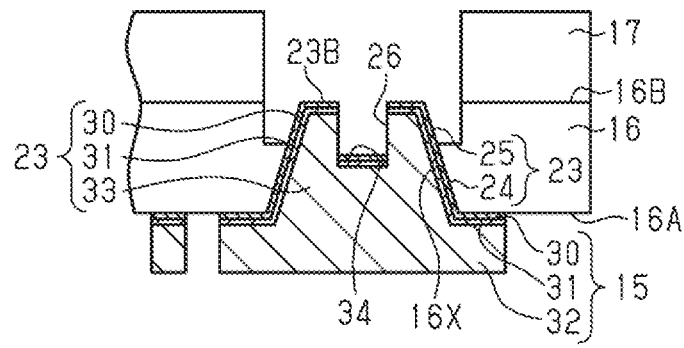

Also, in the process shown in FIG. 13D, a process of thinning the insulating layers 16 and 17 is performed. This thinning process can be performed, for example, by dry etching using only O$_2$ gas.

Figure 14A:
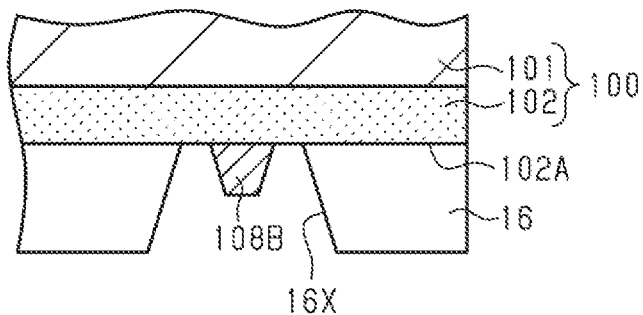
FIGS. 14A to 14D are enlarged cross-sectional views illustrating a method of manufacturing a wiring substrate of a third modification.

As shown in FIG. 14A, on the lower surface 102A of the release layer 102, sacrificial patterns 108B may be formed in such a tapered shape that they gradually thinner from the upper side of FIG. 14A (one side close to the base substrate 100) toward the lower side of FIG. 14A (the other side close to the lower surfaces of the sacrificial patterns 108B). For example, the sacrificial patterns 108B may be formed substantially in such an inverted truncated cone shape that the areas of the lower surfaces are smaller than the areas of the upper surfaces. Also, as the material of the sacrificial patterns 108B, conductive materials which can be removed selectively with respect to the metal film 30 to be formed in the subsequent process by etching can be used. As the material of the sacrificial patterns 108B, for example, a material can be selected from Ni, Al, Cr, and Ta. Also, the sacrificial patterns 108B may have a structure composed of one metal layer, and may have a stacked structure of a plurality of metal layers.

Now, a method of forming the via wirings 23 using the sacrificial patterns 108B will be described.

In the process shown in FIG. 14A, after the sacrificial patterns 108B are formed, on the lower surface 102A of the release layer 102, the insulating layer 16 is formed so as to have the through-holes 16X.

Figure 14B:
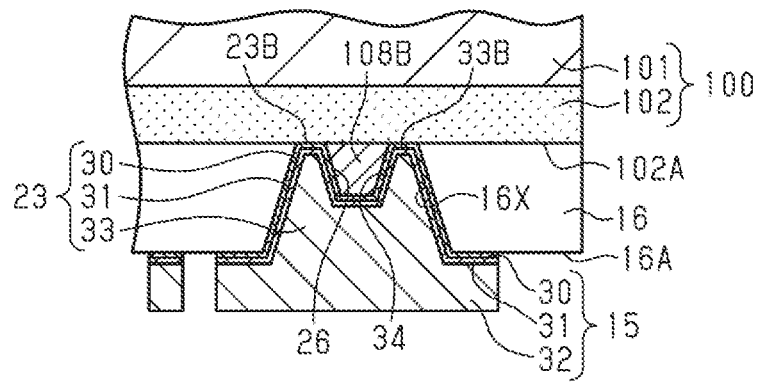

Subsequently, in a process shown in FIG. 14B, similarly in the processes shown in FIGS. 4B to 5A, the via wirings 23 which are composed of the metal films 30 and 31 and the metal layer 33 are formed, and the wiring layer 15 which is composed of the metal films 30 and 31 and the metal layer 33 is formed. At this time, the outer side surfaces of the sacrificial patterns 108B are formed so as to gradually widen from one side close to the lower surfaces of the sacrificial patterns 108B toward the other side close to the upper surfaces of the sacrificial patterns. Therefore, even in a case of forming the metal films 30 and 31 by sputtering, it is possible to suitably form the metal films 30 and 31 to cover the outer side surfaces of the sacrificial patterns 108B. Also, in the present process, the metal films 30 and 31 and the metal layer 33 are formed along the sacrificial patterns 108B formed substantially in the inverted truncated cone shape. As a result, in the upper end surfaces 23B of the via wirings 23, the recesses 26 are formed substantially in an inverted truncated cone shape, and in the upper end surfaces 33B of the metal layer 33, the recesses 34 are formed substantially in an inverted truncated cone shape.

Figure 14C:
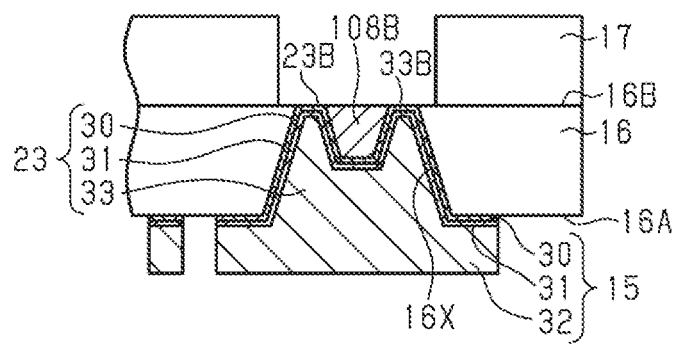

Subsequently, in a process shown in FIG. 14C, the same processes as the processes shown in FIGS. 5B to 7B are performed, whereby a structure which has the insulating layer 17 formed on the upper surfaces 16B of the insulating layer 16 and in which the upper surfaces of the sacrificial patterns 108B and the upper end surfaces 23B of the via wirings 23 are exposed from the upper surface of the insulating layer 16 is obtained.

Figure 14D:
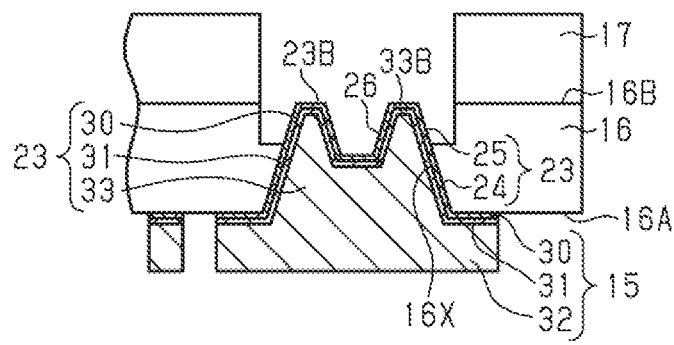

Subsequently, in a process shown in FIG. 14D, similarly in the processes shown in FIGS. 8A and 8B (or the process shown in FIG. 13D), while the sacrificial patterns 108B are removed, the insulating layers 16 and 17 are thinned. As a result, the inner surfaces of the recesses 26 formed substantially in the inverted truncated cone shape are exposed to the outside. Also, the recesses 16Y are formed in the upper surfaces 16B of the insulating layer 16, whereby the outer side surfaces of the upper end portions of the via wirings 23 are exposed to the outside. If the recesses 26 are formed substantially in the inverted truncated cone shape as described above, it is possible to increase the contact area of the via wirings 23 (the metal film 30) and the solder 40.

In the above-described embodiment, the inner side surfaces of the recesses 26 are formed as flat surfaces. However, the present invention is not limited thereto. For example, the inner side surfaces of the recesses 26 may be formed as curved surfaces. Also, the recesses 26 may be formed such that every recess has both of a flat inner side surface and a curved inner side surface.

In the above-described embodiment, the upper end surfaces 23B of the via wirings 23 are formed as flat surfaces. However, the present invention is not limited thereto. For example, the upper end surfaces 23B of the via wirings 23 may be formed as curved surfaces.

In the above-described embodiment, the outer side surfaces of the bumps 25 are formed so as to be inclined straightly as seen in a cross-sectional view. However, the present invention is not limited thereto. For example, the outer side surfaces of the bumps 25 may be formed as curved surfaces.

Figure 15:
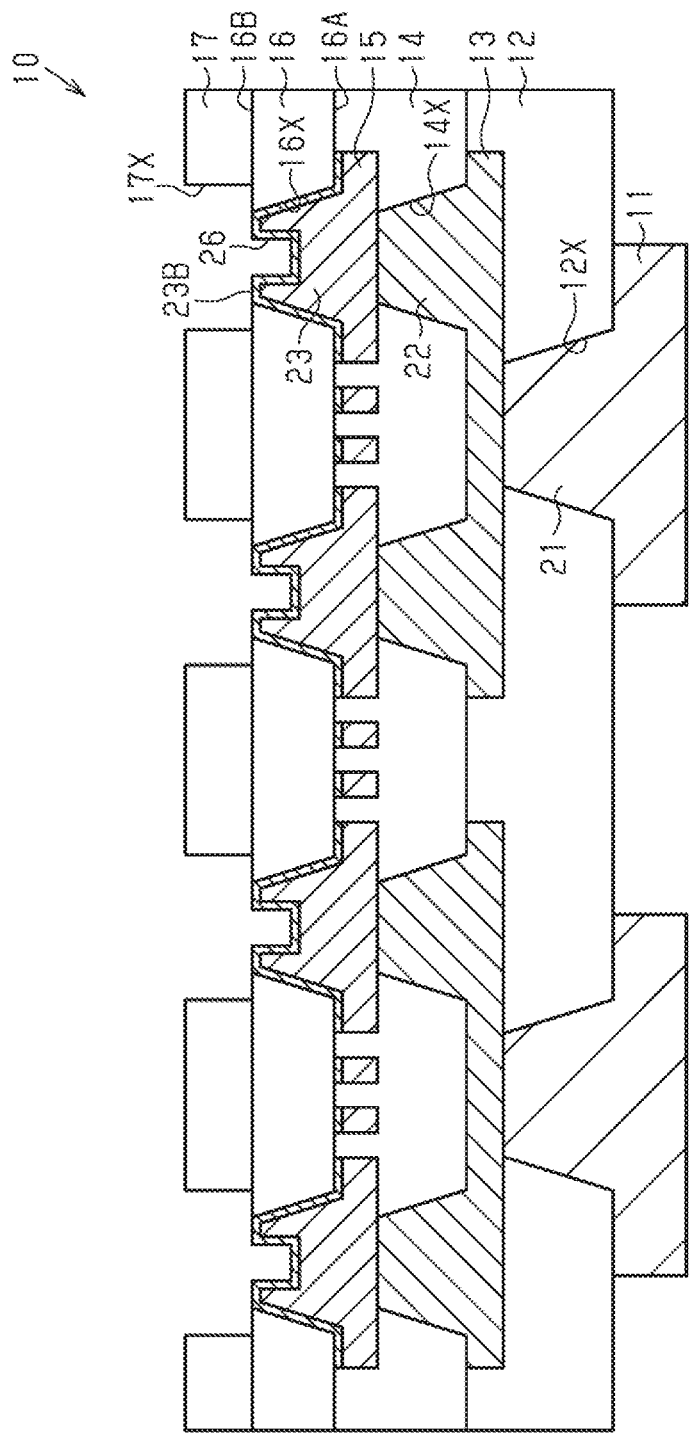
FIG. 15 is a cross-sectional view schematically illustrating a wiring substrate of a fourth modification.

As shown in FIG. 15, formation of the recesses 16Y in the insulating layer 16 may be omitted. In this case, all of the outer side surfaces of the upper end portions of the via wirings 23 contact on the insulating layer 16, and are covered by the insulating layer 16. Even in this case, since the recesses 26 are formed in the upper end surfaces 23B of the via wirings 23, it is possible to achieve the same effect as the effect (1) of the above-described embodiment.

Figure 8A:
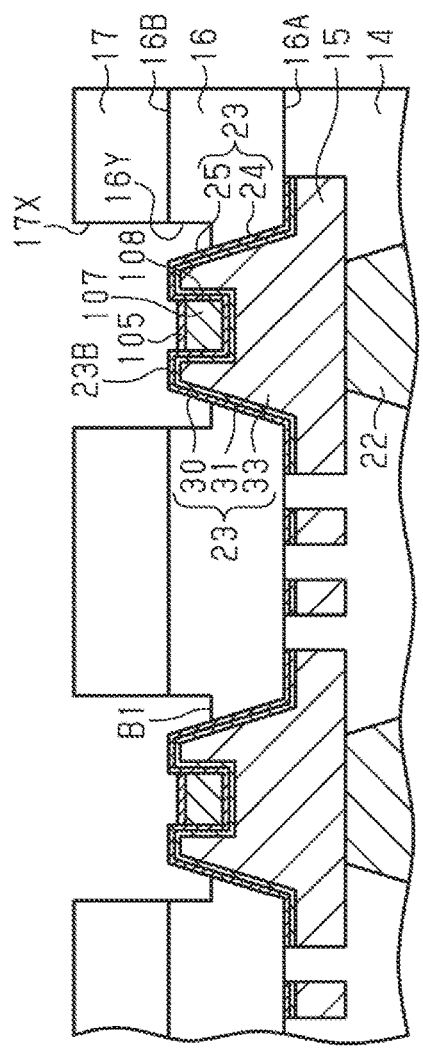
FIGS. 8A and 8B are enlarged cross-sectional views illustrating the method of manufacturing the wiring substrate of the embodiment.
Figure 8B:
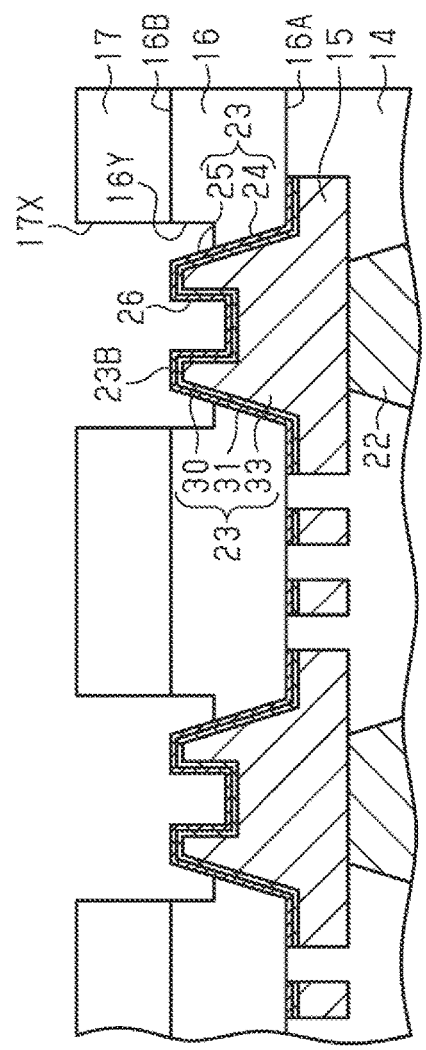

Also, the structure shown in FIG. 15 can be formed by omitting the process of thinning the insulating layers 16 and 17 from the process shown in FIG. 8A.

Figure 16:
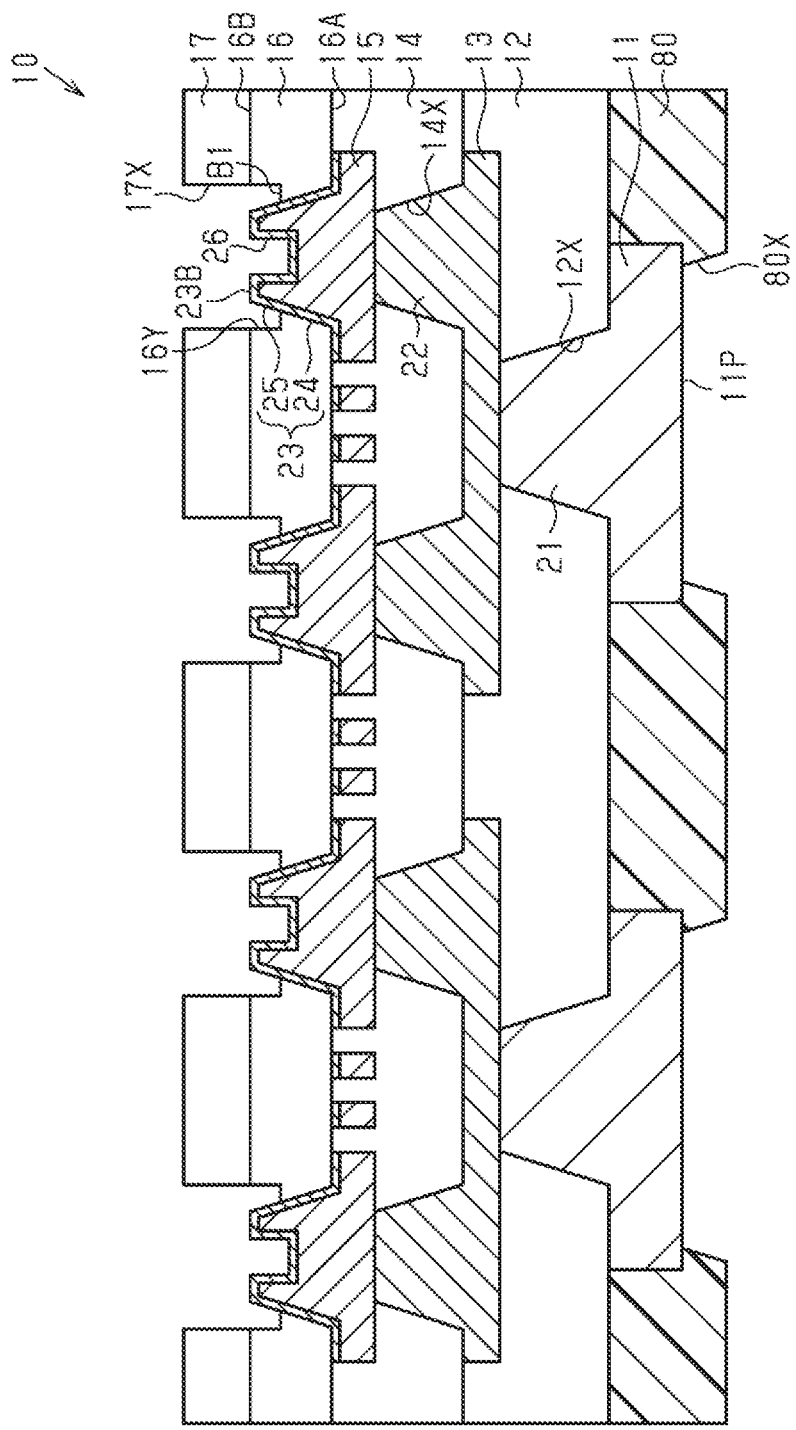
FIG. 16 is a cross-sectional view schematically illustrating a wiring substrate of a fifth modification.

As shown in FIG. 16, on the lower surface of the insulating layer 12, a solder resist layer 80 may be formed so as to cover the wiring layer 11. The solder resist layer 80 has openings 80X for exposing, for example, some portions of the wiring layer 11 which is the lowermost layer, as external connection pads 11P. On the portions the wiring layer 11 exposed from the openings 80X (that is, on the external connection pads 11P), a surface treatment layer may be formed if necessary.

In this case, for example, after the wiring substrate 10 is formed on the base substrate 110, the base substrate 110 is removed from the wiring substrate 10. Then, on the lower surface of the insulating layer 12 exposed to the outside by the removal of the base substrate 110, the solder resist layer 80 is formed.

Also, in the present modification, as a protective insulating layer to be the outermost layer of the wiring substrate 10, the solder resist layer 80 has been exemplified. However, the protective insulating layer can be formed of various insulating resins having photosensitivity.

On the upper surface of the insulating layer 17 of the above-described embodiment, a protective insulating layer (for example, a solder resist layer) may be formed.

The insulating layer 17 of the above-described embodiment may be omitted.

In the above-described embodiment, the planar arrangement, planar shape, and number of recesses 26 are not particularly limited.

For example, as shown in FIG. 17A, the planar shape of the recesses 26 may be substantially a cross shape. Also, as shown in FIG. 17B, the planar shape of the recesses 26 may be substantially a grid shape. In the examples shown in FIGS. 17A and 17B, the recesses 26 are formed such that their end portions in the planar direction extend to the outer side surfaces of the via wirings 23. In this case, the inner surface of the recesses 26 are exposed from the outer side surfaces of the via wirings 23. However, the planar shape of the recesses 26 is not limited thereto, and the recesses 26 may be formed such that their end portions in the planar direction do not extend to the outer side surfaces of the via wirings 23.

Alternatively, as shown in FIG. 17C, in each of the upper end surfaces 23B of the via wirings 23, a plurality of recesses 26 (in FIG. 17C, four) may be formed. In the present modification, the planar shape of each recess 26 may be substantially a fan shape.

Also, in the upper end surfaces 23B of the via wirings 23, the recesses 26 may be formed in a planar shape different from that of the recesses 26 shown in FIGS. 17A to 17C (for example, in a strip shape or a wave shape). Also, in each of the upper end surfaces 23B, a plurality of recesses 26 having different planar shapes may be formed.

In the above-described embodiment, the semiconductor device 60 is mounted on the wiring substrate 10, and the sealing resin 70 is formed to seal the semiconductor device 60, and then the base substrate 110 is removed. However, the timing of removal of the base substrate 110 is not limited thereto. In other words, as long as it is possible to secure sufficient rigidity by only a structure obtained by removing the base substrate 110, the timing of removal of the base substrate 110 is not particularly limited thereto. For example, the base substrate 110 may be removed immediately after the wiring substrate 10 is formed on the base substrate 110. In this case, after the base substrate 110 is removed, mounting of the semiconductor device 60 and forming of the sealing resin 70 are performed.

In the above-described embodiment, the upper end surfaces 23B of the via wirings 23 (the upper surface of the metal film 30) and the upper surfaces 16B of the insulating layer 16 are formed substantially on the same plane. However, the present invention is not limited thereto, and the upper end surfaces 23B of the via wirings 23 may be formed at a certain depth on the lower side from the upper surfaces 16B of the insulating layer 16. Also, the upper end surfaces 23B of the via wirings 23 may be formed so as to protrude upward from the upper surfaces 16B of the insulating layer 16.

In the above-described embodiment, as the materials of the insulating layers 12, 14, 16, and 17, insulating resins containing photosensitive resins as their main components are used. However, the present invention is not limited thereto, and as the materials of the insulating layers 12, 14, 16, and 17, insulating resins containing thermoplastic resins as their main components may also be used.

In the above-described embodiment, the wiring layers 11, 13, and 15 and the insulating layers 12, 14, 16, and 17 are formed. However, the number of wiring layers, the number of the insulating layers, and the layout of wirings can be variously modified and changed.

In the above-described embodiment, the semiconductor device 60 is mounted on the wiring substrate 10. However, the present invention is not limited thereto. For example, in place of the semiconductor device 60, a chip component such as a chip capacitor, a chip resistor, or a chip inductor, or an electronic device such as a quartz resonator may be mounted on the wiring substrate 10.

In the above-described embodiment, the sealing resin 70 is formed so as to cover the rear surface of the semiconductor device 60. However, the present invention is not limited thereto, and the sealing resin 70 may be formed so as to expose the rear surface of the semiconductor device 60.

In the semiconductor device 50 of the above-described embodiment, between each semiconductor device 60 and the wiring substrate 10, an underfill resin may be applied.

The above-described embodiment and the modifications may be appropriately combined.

This disclosure further encompasses various exemplary embodiments, for example, described below.

1. A method of manufacturing a wiring substrate, comprising:

preparing a base substrate;

forming a sacrificial pattern on a lower surface of the base substrate;

forming a first insulating layer on the lower surface of the base substrate so as to have a first through-hole and overlap the sacrificial pattern as seen in a plan view;

forming a via wiring in the first through-hole while forming a wiring layer on a lower surface of the first insulating layer such that the wiring layer is connected to the via wiring;

removing the base substrate; and removing the sacrificial pattern.

2. The method of manufacturing a wiring substrate according to claim 1, further comprising: after the removing the base substrate, forming a second insulating layer on an upper surface of the first insulating layer so as to have a second through-hole exposing the whole of an upper end surface of the via wiring; and thinning the second insulating layer and the first insulating layer from an upper surface side of the second insulating layer, thereby forming a second recess so as to expose an outer side surface of an upper end portion of the via wiring.

3. The method of manufacturing a wiring substrate according to claim 1 or 2, wherein:
the forming the via wiring includes:
forming a second metal film so as to cover a lower surface and a side surface of the sacrificial pattern exposed from a bottom of the first through-hole and an inner surface of the first through-hole exposed from the sacrificial pattern;
forming a first metal film so as to cover a surface of the second metal film; and
forming a first metal layer so as to fill an inner space of the first through-hole defined by a portion of the first metal film formed inside the first through-hole; and
in the removing the sacrificial pattern, the sacrificial pattern is removed selectively with respect to the second metal film by wet etching.

4. The method of manufacturing a wiring substrate according to claim 1 or 2, wherein:
in the forming the sacrificial pattern, the sacrificial pattern is formed on the lower surface of the base substrate so as to have a stacked structure of a third metal film, a fourth metal film, and a second metal layer arranged in this order, and
the forming the via wiring includes:
forming a second metal film thicker than the third metal film so as to cover a lower surface and a side surface of the sacrificial pattern exposed from a bottom of the first through-hole and an inner surface of the first through-hole exposed from the sacrificial pattern;
forming a first metal film so as to cover a surface of the second metal film; and
forming a first metal layer so as to fill an inner space of the first through-hole defined by a portion of the first metal film formed inside the first through-hole, and
the removing the sacrificial pattern includes:
removing the third metal film while thinning the second metal film, by dry etching; and
removing the fourth metal film and the second metal layer selectively with respect to the second metal film by wet etching.

5. The method of manufacturing a wiring substrate according to any one of claims 1 to 4, wherein:
in the forming the sacrificial pattern, the sacrificial pattern is formed so as to gradually become thinner toward one side close to the base substrate.

What is claimed is:
1. A wiring substrate comprising:
a first insulating layer including a first through-hole formed through the first insulating layer in a thickness direction;
a wiring layer formed on a lower surface of the first insulating layer; and
a via wiring filled in the first through-hole and connected to the wiring layer, the via wiring having such a shape that it gradually becomes thinner from one side close to the lower surface of the first insulating layer toward the other side close to an upper surface of the first insulating layer, the via wiring including a first recess formed in an upper end surface of the via wiring,
wherein
an upper end portion of the via wiring is an electrode pad for electric connection with an electronic component,
the upper end surface of the via wiring is positioned to be substantially planar with the upper surface of the first insulating layer,
the first insulating layer includes a second recess formed so as to expose an outer side surface of the upper end portion of the via wiring and overlap the first through-hole as seen in a plan view,
the upper end portion of the via wiring is formed so as to protrude upward from a bottom of the second recess, and
the upper end portion of the via wiring is surrounded by the first insulating layer forming an inner side surface of the second recess as seen in a plan view.

2. The wiring substrate according to claim 1, further comprising:
a second insulating layer formed on an upper surface of the first insulating layer,
wherein the second insulating layer includes a second through-hole formed so as to expose the whole of the upper end portion of the via wiring.

3. The wiring substrate according to claim 1, wherein:
the via wiring includes a metal layer having such a shape that it gradually becomes thinner from one side close to the lower surface of the first insulating layer toward the other side close to the upper surface of the first insulating layer, a first metal film covering a surface of the metal layer, and a second metal film covering a surface of the first metal film and contacting on an inner side surface of the first through-hole, and
the second metal film is formed of a material having adhesion to the first insulating layer higher than the first metal film has.

4. The wiring substrate according to claim 1, wherein:
an inner surface of the first recess is a roughened surface having a degree of surface roughness higher than that of the upper end surface of the via wiring.

5. A semiconductor device comprising:
the wiring substrate according to claim 1;
a solder provided on the upper end portion of the via wiring so as to fill the first recess; and
the electronic component connected to the via wiring by the solder.

6. The wiring substrate according to claim 1, wherein a diameter of the via wiring at the upper end surface is smaller than a diameter of the via wiring at a lower end surface.

7. The wiring substrate according to claim 1, wherein a diameter of the via wiring continuously decreases from a lower end surface of the via wiring toward the upper end surface of the via wiring.

8. The wiring substrate according to claim 1, wherein the upper end portion of the via wiring including the upper end surface of the via wiring does not protrude upwardly from the upper surface of the first insulating layer.

9. The wiring substrate according to claim 1, wherein the electronic component is an electronic device.

* * * * *